(12) United States Patent
Shimizu

(10) Patent No.: US 6,507,085 B2
(45) Date of Patent: Jan. 14, 2003

(54) SEMICONDUCTOR DEVICE COMPRISING DIODE

(75) Inventor: Kazuhiro Shimizu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/963,431

(22) Filed: Sep. 27, 2001

(65) Prior Publication Data

US 2002/0113286 A1 Aug. 22, 2002

(30) Foreign Application Priority Data

Feb. 20, 2001 (JP) .......................................... 2001-043501
May 16, 2001 (JP) .......................................... 2001-146256

(51) Int. Cl.[7] ....................... H01L 29/00; H01L 29/861; H01L 31/107
(52) U.S. Cl. ....................... 257/502; 257/501; 257/506; 257/481; 257/603
(58) Field of Search ....................... 257/499–506, 257/603, 481

(56) References Cited

U.S. PATENT DOCUMENTS

| | | | | |
|---|---|---|---|---|
| 5,300,805 A | * | 4/1994 | Demicheli et al. | .......... 257/546 |
| 5,444,291 A | * | 8/1995 | Paparo et al. | ................ 257/552 |
| 5,491,358 A | * | 2/1996 | Miyata | ........................ 257/546 |
| 5,665,994 A | * | 9/1997 | Palara | ......................... 257/378 |
| 5,874,767 A | | 2/1999 | Terashima et al. | |
| 6,057,578 A | * | 5/2000 | Aiello et al. | ................. 257/355 |

* cited by examiner

*Primary Examiner*—Jerome Jackson
*Assistant Examiner*—Jesse A. Fenty
(74) *Attorney, Agent, or Firm*—Oblon, Spivak, McClelland, Maier & Neustadt, P.C.

(57) ABSTRACT

A semiconductor device is provided which minimizes a reduction in the breakdown voltage caused by a metal electrode to which a high voltage is applied. An $n^-$ semiconductor layer (3) is formed on a $p^-$ semiconductor substrate (1). A $p^+$ impurity region (4) is formed within the $n^-$ semiconductor layer (3), extending from the surface of the $n^-$ semiconductor layer (3) to the interface of the $n^-$ semiconductor layer (3) and the $p^-$ semiconductor substrate (1). The $p^+$ impurity region (4) is formed to surround part of the $n^-$ semiconductor layer (3) and forms a high-potential island region (101) where a logic circuit (103), an $n^+$ impurity region (5) which is a cathode region of a bootstrap diode (102), and a $p^+$ impurity region (6) which is an anode region are located.

10 Claims, 22 Drawing Sheets

F I G. 1
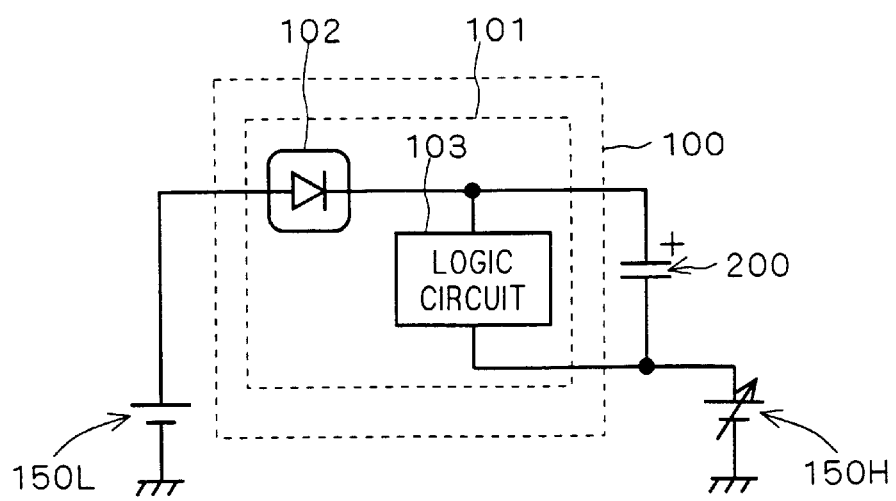

F I G. 12
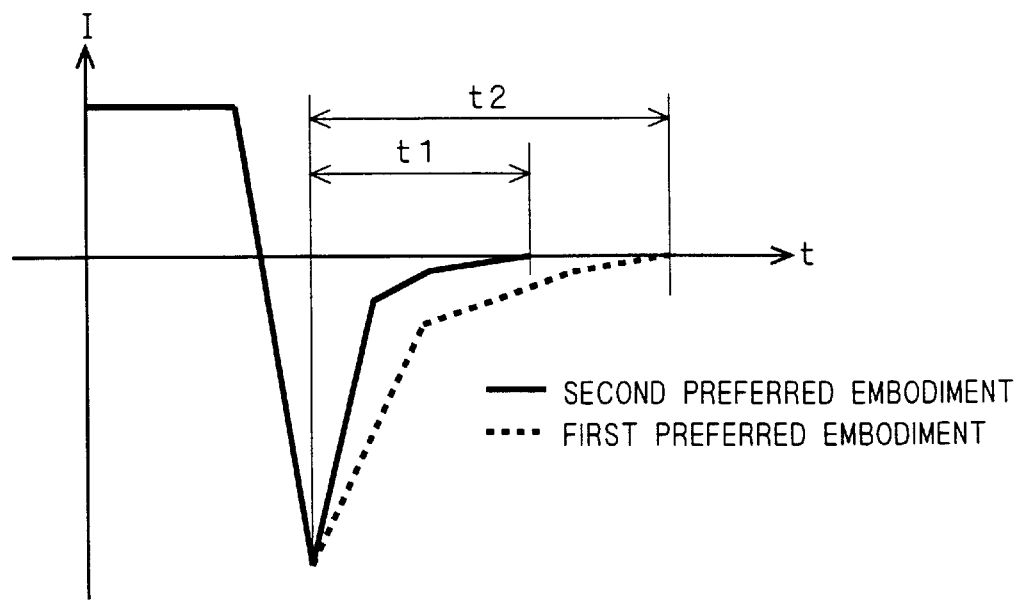
F I G. 13
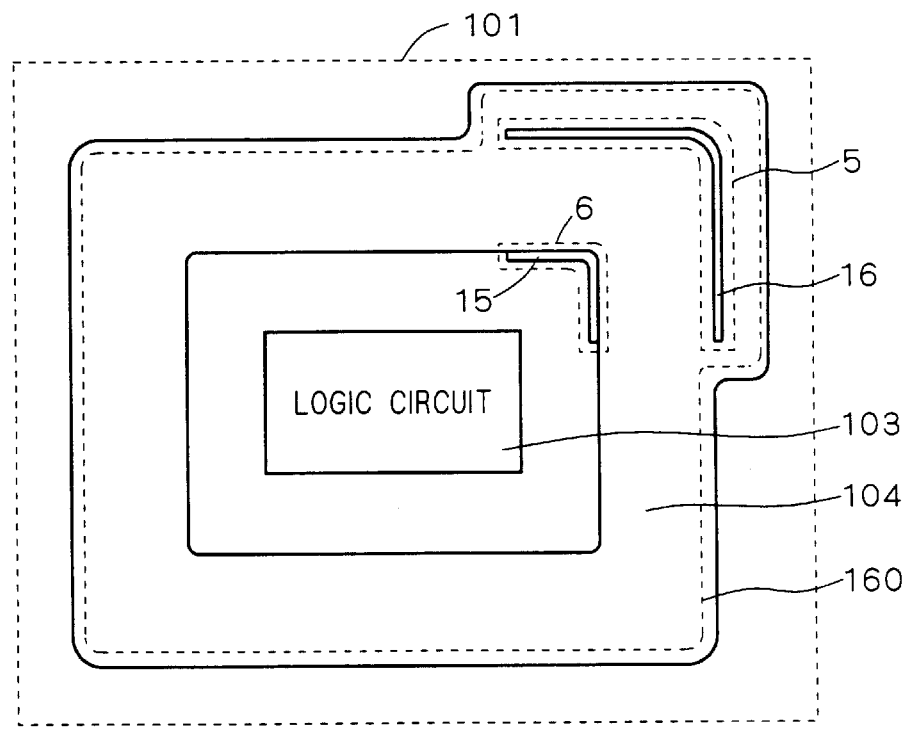

SEMICONDUCTOR DEVICE COMPRISING DIODE

BACKGROUND OF THE INVENTION

1. Field of the Invention

The present invention relates to a semiconductor device, and especially to a high voltage IC (hereinafter referred to as an "HVIC") comprising a bootstrap diode.

2. Description of the Background Art

FIG. 29 is a circuit diagram of a conventional HVIC 110 and its peripheral circuits. As shown in FIG. 29, the conventional HVIC 110 comprises a bootstrap diode 102 and a logic circuit 103 formed in a high-potential island region 101. In the periphery of the HVIC 110, a bootstrap capacitance 200 is located in parallel with the logic circuit 103. A cathode of the bootstrap diode 102 is connected to one end of the logic circuit 103. A voltage source 150L is connected to an anode of the bootstrap diode 102.

Now, operations in the circuit diagram of FIG. 29 will be set forth. When a voltage at the voltage source 150L is higher than that at a virtual voltage source 150H which is a virtual variable voltage source for determining a potential at the other end of the logic circuit 103, the bootstrap diode 102 is forward biased and the voltage is supplied from the voltage source 150L to the logic circuit 103. At this time, an electric charge is applied to the bootstrap capacitance 200 and a potential at the cathode of the bootstrap diode 102 rises to (V1−Vrec), where Vrec is the forward voltage of the bootstrap diode 102 and V1 is the voltage at the voltage source 150L.

When, with the bootstrap capacitance 200 charged, the voltage at the virtual voltage source 150H increases by ΔV (>Vrec), the potential at the cathode of the bootstrap diode 102 becomes V1−Vrec+ΔV (>V1). The bootstrap diode 102 is thus reverse biased and the current supply from the voltage source 150L to the logic circuit 103 comes to a stop. At this time, the electric charge on the bootstrap capacitance 200 is supplied to the logic circuit 103.

FIG. 30 is a schematic plan view of a configuration of the conventional HVIC 110, and FIG. 31 is a cross-sectional view taken along the line F—F indicated by the arrows. To avoid the complexity of the drawing, an insulating film 8 of FIG. 31 is not shown in FIG. 30, which shows only a cathode and an anode electrodes 15, 16 of the bootstrap diode 102 and a metal electrode 14, out of the electrodes formed on an insulating film 18. The conventional HVIC 110 utilizes a RESURF (reduced surface field) effect to provide isolation between the logic circuit 103 and the bootstrap diode 102.

In the conventional HVIC 110, as shown in FIGS. 30 and 31, an n⁻ semiconductor layer 3 is formed on a p⁻ semiconductor substrate 1. An n⁺ buried impurity region 2 is selectively formed at the interface between the p⁻ semiconductor substrate 1 and the n⁻ semiconductor layer 3, and the logic circuit 103 is formed in the surface of the n⁻ semiconductor layer 3 above the n⁺ buried impurity region 2. Near the end portion of the n⁺ buried impurity region 2, an n⁺ impurity region 5 extending from the surface of the n⁻ semiconductor layer 3 to the n⁺ buried impurity region 2 is formed to surround the logic circuit 103.

The n⁺ impurity region 5 includes n⁺ impurity regions 5a and 5b. The n⁺ impurity region 5a is formed in the surface of the n⁻ semiconductor layer 3 and connected to a metal electrode 55 which will be later described. The n⁺ impurity region 5b is connected to the n⁺ impurity region 5a and extends to the n⁺ buried impurity region 2.

On the side of the n⁺ impurity region 5 opposite the logic circuit 103, a p⁺ impurity region 7 is formed in the surface of the n⁻ semiconductor layer 3, apart from the n⁺ impurity region 5, to surround the logic circuit 103 and the n⁺ impurity region 5. In the surface of the n⁻ semiconductor layer 3 between the p⁺ impurity region 7 and the n⁺ impurity region 5, an oxide film 12 is formed, on which an electrode 19b is formed. This electrode 19b forms a so-called "multiple field plate" for improved breakdown voltage.

The logic circuit 103 comprises, for example, a p-channel MOSFET 130. The p-channel MOSFET 130 comprises a p⁺ drain region 31, a p⁺ source region 32, and a gate electrode 36. The drain region 31 and the source region 32 are formed with predetermined spacing in the surface of the n⁻ semiconductor layer 3, and the gate electrode 36 is formed through a gate insulating film 34 on the n⁻ semiconductor layer 3 between the drain and source regions 31 and 32. Further in the surface of the n⁻ semiconductor layer 3, an n⁺ impurity region 30 is formed adjacent to the drain region 31 with the oxide film 12 in between.

Apart from the buried impurity region 2, a buried impurity region 28 is selectively formed at the interface between the p⁻ semiconductor substrate 1 and the n⁻ semiconductor layer 3. Extending from this buried impurity region 28 to the surface of the n⁻ semiconductor layer 3, an n⁺ impurity region 45 is formed which is a cathode region of the bootstrap diode 102. The n⁺ impurity region 45 includes n⁺ impurity regions 45a and 45b. The n⁺ impurity region 45a is formed in the surface of the n⁻ semiconductor layer 3 and connected to the cathode electrode 15 which will be later described. The n⁺ impurity region 45b is connected to the n⁺ impurity region 45a and extends to the n⁺ buried impurity region 28.

A p⁺ impurity region 6, which is an anode region of the bootstrap diode 102, is formed apart from the p⁺ impurity region 7 in the surface of the n⁻ semiconductor layer 3 to surround the n⁺ impurity region 45. In the surface of the n⁻ semiconductor layer 3 between the n⁺ impurity region 45 and the p⁺ impurity region 6, the oxide film 12 is formed, on which an electrode 19a is formed. This electrode 19a also forms a multiple field plate.

Between the p⁺ impurity regions 6 and 7, a p⁺ impurity region 4 extending from the interface between the p⁻ semiconductor substrate 1 and the n⁻ semiconductor layer 3 to the surface of the n⁻ semiconductor layer 3 is formed in connection only with the p⁺ impurity region 7. The p⁺ impurity region 4 is formed to surround the n⁺ impurity region 45 and the p⁺ impurity region 6 and to surround the p⁺ impurity region 7, the n⁺ impurity region 5, and the logic circuit 103. That is, the bootstrap diode 102 and the high-potential island region 101 are isolated by the p⁺ impurity region 4.

The insulating film 18 is formed to cover the n⁻ semiconductor layer 3, the oxide film 12, the gate electrode 36, and the electrodes 19a and 19b. Through the insulating film 18, the anode electrode 16 is connected to the p⁺ impurity region 6, the cathode electrode 15 to the n⁺ impurity region 45, and the metal electrode 55 to the n⁺ impurity region 5. A metal electrode 35 is connected through the insulating film 18 to the drain region 31, the source region 32, the gate electrode 36, and the n⁺ impurity region 30. The cathode electrode 15 is connected by the metal electrode 14 to the metal electrode 55 and further to the metal electrode 35 on the drain region 31 and the n⁺ impurity region 30. This provides connection for the cathode of the bootstrap diode 102 and the logic circuit 103 as shown in FIG. 29. A floating metal electrode 50 is located on the insulating film 18 above the electrode 19a and its capacitive coupling to the electrode 19a improves the breakdown voltage. The insulating film 8 is formed on the insulating film 18 to cover the respective electrodes.

Now, an isolation region 104 and a region 105 of FIG. 30 will be set forth. The logic circuit 103 is surrounded by the $n^+$ impurity region 5 and further by the $p^+$ impurity region 4 outside the $n^+$ impurity region 5. The $n^-$ semiconductor layer 3 between the $p^+$ impurity region 4 and the $n^+$ impurity region 5 is covered with a depletion layer due to the RESURF effect. More specifically, for example when the $p^-$ semiconductor substrate 1 and the $p^+$ impurity region 4 are connected to a ground potential and a positive voltage is applied to the $n^-$ semiconductor layer 3 and the $n^-$ impurity region 5, a negative voltage is applied to a pn junction of the $p^-$ semiconductor substrate 1, the $p^+$ impurity region 4, the $n^-$ semiconductor layer 3, and the $n^+$ impurity region 5. A resultant RESURF effect leads to the formation of a depletion layer across the whole $n^-$ semiconductor layer 3 between the $p^+$ impurity region 4 and the $n^+$ impurity region 5. The isolation region 104 refers to a region where the depletion layer is formed. Here, the logic circuit 103 is surrounded by the $n^+$ impurity region 5 and the $p^+$ impurity region 4 or, in other words, it is surrounded by the isolation region 104 as shown in FIG. 30.

Similarly, the RESURF effect leads to the formation of a depletion layer across the whole $n^-$ semiconductor layer 3 between the $n^+$ impurity region 45 and the $p^+$ impurity region 4. That is, a depletion layer covers almost the whole of the $n^-$ semiconductor layer 3 which is surrounded by the $p^+$ impurity region 4 and where the bootstrap diode 102 is formed. The region 105 refers to a region where the depletion layer is formed.

The conventional HVIC 110 with the aforementioned configuration achieves a high breakdown voltage because even the surface of the $n^-$ semiconductor layer 3 is covered with a depletion layer due to the RESURF effect of the $p^-$ semiconductor substrate 1 and the $n^-$ semiconductor layer 3. Above the $p^+$ impurity region 4 connected to the $p^-$ semiconductor substrate 1, however, the metal electrode 14 is located to which for example a high voltage of several hundred volts is applied. This inhibits the spread of a depletion layer in the $n^-$ semiconductor layer 3, posing a problem of breakdown voltage reduction.

SUMMARY OF THE INVENTION

A first aspect of the present invention is directed to a semiconductor device comprising: a semiconductor substrate of p-type; a semiconductor layer of n-type formed on the semiconductor substrate; a first impurity region of the p-type formed in the semiconductor layer, extending from a surface of the semiconductor layer to an interface of the semiconductor layer and the semiconductor substrate, to define an island region; a buried impurity region of the n-type formed apart from the first impurity region at the interface within the island region, the buried impurity region being of a higher concentration than the semiconductor layer; a semiconductor element formed in the surface of the semiconductor layer above the buried impurity region; and a diode having a second impurity region of the p-type and a third impurity region of the n-type, the second impurity region being formed in the surface of the semiconductor layer above the interface between the first impurity region and the buried impurity region, the third impurity region being formed in the surface of the semiconductor layer apart from and between the second impurity region and the semiconductor element, wherein a potential applied to the semiconductor substrate and the first impurity region is lower than that applied to the second impurity region and the third impurity region.

According to a second aspect of the present invention, in the semiconductor device of the first aspect, a depth of the second impurity region in a direction to the semiconductor substrate and a distance between the second impurity region and the first impurity region are determined to provide a desired emitter-collector breakdown voltage of a parasitic bipolar transistor in which the semiconductor substrate and the first impurity region serve as an emitter, the semiconductor layer as a base, and the second impurity region as a collector.

According to a third aspect of the present invention, the semiconductor device of either of the first and second aspects further comprises: a fourth impurity region of the p-type connected to the second impurity region and formed in the surface of the semiconductor layer, extending toward the third impurity region, the fourth impurity region being of a lower concentration than the second impurity region.

According to a fourth aspect of the present invention, in the semiconductor device of the third aspect, a depletion layer is formed across the whole of the fourth impurity region.

According to a fifth aspect of the present invention, in the semiconductor device of either of the first through fourth aspects, the first impurity region has a bent portion, and the second impurity region and the third impurity region are opposed to each other along the bent portion.

According to a sixth aspect of the present invention, in the semiconductor device of either of the first through fourth aspects, the second impurity region and the third impurity region are opposed to each other along the first impurity region, and the third impurity region is longer in length than the second impurity region along the surface of the semiconductor layer.

A seventh aspect of the present invention is directed to a semiconductor device comprising: a semiconductor substrate of p-type; a semiconductor layer of n-type formed on the semiconductor substrate; a first impurity region of the p-type formed in the semiconductor layer, extending from a surface of the semiconductor layer to an interface of the semiconductor layer and the semiconductor substrate, to define a first island region and a second island region; a buried impurity region of the n-type formed apart from the first impurity region at the interface of the semiconductor layer and the semiconductor substrate within the first island region; a semiconductor element formed in the surface of the semiconductor layer above the buried impurity region; a diode having a second impurity region of the p-type and a third impurity region of the n-type which are formed in the surface of the semiconductor layer within the second island region, the second impurity region being located closer to the semiconductor element than the third impurity region; a metal electrode connected to the third impurity region and passing over the second impurity region and the first impurity region to be connected to the semiconductor element; and a fourth impurity region of the p-type connected to the second impurity region and formed in the surface of the semiconductor layer to be located below the metal electrode, the fourth impurity region being of a lower concentration than the second impurity region, wherein a potential applied to the semiconductor substrate and the first impurity region is lower than that applied to the second impurity region and the third impurity region.

An eighth aspect of the present invention is directed to a semiconductor device comprising: a semiconductor substrate of p-type; a semiconductor layer of n-type formed on the semiconductor substrate; a first impurity region of the p-type formed in the semiconductor layer, extending from a surface of the semiconductor layer to an interface of the semiconductor layer and the semiconductor substrate, to define a first island region and a second island region; a buried impurity region of the n-type formed apart from the first impurity region at the interface of the semiconductor layer and the semiconductor substrate within the first island region, the buried impurity region being of a higher concentration than the semiconductor layer; a semiconductor element formed in the surface of the semiconductor layer above the buried impurity region; a diode having a second impurity region of the p-type and a third impurity region of the n-type which are formed in the surface of the semiconductor layer within the second island region; a metal electrode connected to the third impurity region and passing over the first impurity region to be connected to the semiconductor element; and a fourth impurity region of the p-type connected to the first impurity region and formed in the surface of the semiconductor layer to be located below the metal electrode, the fourth impurity region being of a lower concentration than the first impurity region, wherein a potential applied to the semiconductor substrate and the first impurity region is lower than that applied to the second impurity region and the third impurity region.

According to a ninth aspect of the present invention, in the semiconductor device of either of the seventh and eighth aspects, a depletion layer is formed across the whole of the fourth impurity region.

In the semiconductor device of the first aspect, since the potential applied to the semiconductor substrate and the first impurity region is lower than that applied to the second impurity region and the third impurity region, application of a reverse voltage to the diode leads to the spread of a depletion layer from a junction between the semiconductor layer and both the semiconductor substrate and the first impurity region to the semiconductor layer. The semiconductor element is thus covered with the depletion layer, gaining protection.

The semiconductor device of the second aspect achieves a desired emitter-collector breakdown voltage of the parasitic bipolar transistor. This improves the breakdown voltage of the semiconductor device.

In the semiconductor device of the third aspect, the p-type fourth impurity region of a lower concentration than the second impurity region is connected to the second impurity region and extends toward the third impurity region. Thus, holes existing in the vicinity of the third impurity region are drawn back to the fourth impurity region. This shortens a recovery operating time for the diode.

In the semiconductor device of the fourth aspect, the whole of the fourth impurity region is covered with a depletion layer, which improves the breakdown voltage.

In the semiconductor device of the fifth aspect, the second impurity region and the third impurity region are opposed to each other along the bent portion of the first impurity region. Thus, even when the second impurity region is larger in area than the third impurity region, holes from the second impurity region are hard to enter the semiconductor element. This reduces unstable operations of the semiconductor device caused by hole injection.

In the semiconductor device of the sixth aspect, since the third impurity region is longer in length than the second impurity region along the surface of the semiconductor layer, holes from the second impurity region are hard to enter the semiconductor element. This reduces unstable operations of the semiconductor device caused by hole injection.

In the semiconductor device of the seventh aspect, since the fourth impurity region connected to the second impurity region is formed below the metal electrode, application of a reverse voltage to the diode leads to the formation of a depletion layer extending from a junction of the fourth impurity region and the semiconductor layer. Thus, even if application of a high voltage to the metal electrode which passes over the first impurity region inhibits the spread of the depletion layer in the semiconductor layer, breakdown voltage reduction can be minimized.

In the semiconductor device of the eighth aspect, since the fourth impurity region connected to the first impurity region is formed below the metal electrode and a lower potential is applied to the semiconductor substrate and the first impurity region than to the second impurity region and the third impurity region, application of a reverse voltage to the diode leads to the formation of a depletion layer extending from a junction of the fourth impurity region and the semiconductor layer. Thus, even if application of a high voltage to the metal electrode which passes over the first impurity region inhibits the spread of the depletion layer in the semiconductor layer, breakdown voltage reduction can be minimized.

In the semiconductor device of the ninth aspect, the formation of the depletion layer across the whole of the fourth impurity region further improves the breakdown voltage.

An object of the present invention is to provide a semiconductor device which minimizes breakdown voltage reduction caused by the metal electrode to which a high voltage is applied.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram of an HVIC 100 and its peripheral circuits according to a first preferred embodiment;

FIG. 12 illustrates recovery properties of a bootstrap diode 102;

FIG. 13 is a schematic plan view of a configuration of an HVIC according to a third preferred embodiment;

DESCRIPTION OF THE PREFERRED EMBODIMENTS

First Preferred Embodiment

Figure 2A:
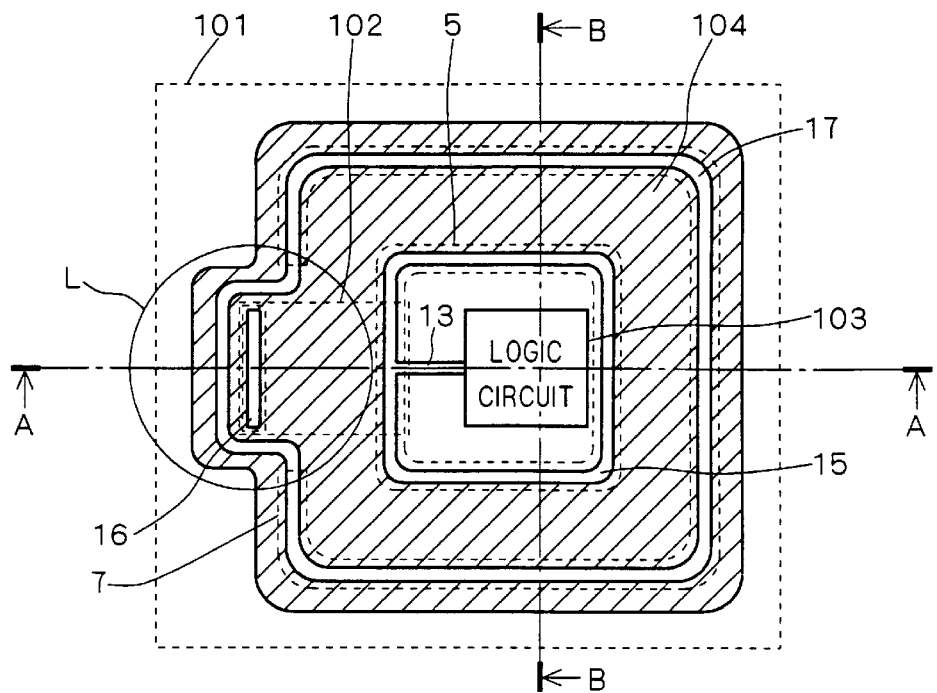
FIGS. 2A and 2B are schematic plan views of a configuration of the HVIC 100 according to the first preferred embodiment.

FIG. 1 is a circuit diagram of an HVIC 100 and its peripheral circuits according to a first preferred embodiment of the present invention. As shown in FIG. 1, the HVIC 100 of the first preferred embodiment comprises a logic circuit 103 and a bootstrap diode 102, the cathode of which is connected to one end of the logic circuit 103, in a high-potential island region 101. In the periphery of the HVIC 100, a bootstrap capacitance 200 is connected in parallel with the logic circuit 103. A voltage source 150L is connected to the anode of the bootstrap diode 102. The voltage source 150L is, for example, a constant voltage source, while a virtual voltage source 150H is a virtual variable voltage source as will be described later.

Now, operations in the circuit diagram of FIG. 1 will be set forth. The cathode of the bootstrap diode 102 and one end of the bootstrap capacitance 200 are connected to, for example, a positive power supply of the logic circuit 103. The other end of the bootstrap capacitance 200 is connected to a load not shown as well as connected to, for example, a negative power supply of the logic circuit 103. A potential at the point of connection varies with load conditions and therefore, it is assumed to be given by the virtual voltage source 150H. Suppose that V1 is the potential with respect to the ground potential, provided by the voltage source 150L (hereinafter the potential with respect to the ground potential is simply referred to as a "voltage") and V2 is the initial voltage provided by the virtual voltage source 150H. When, with the bootstrap capacitance 200 uncharged, the voltage source 150L and the virtual voltage source 150H produce respectively the voltages V1 and V2 which satisfy V1>V2, the bootstrap diode 102 is forward biased and the voltage V1 is applied to the positive power supply of the logic circuit 103. Then, the bootstrap capacitance 200 becomes charged to a voltage of (V1−V2). A resultant application of the voltage (V1−V2) to the logic circuit 103 effects the operation of the logic circuit 103. The value of voltage applied to the positive power supply of the logic circuit 103 is strictly determined by subtracting a forward voltage drop across the bootstrap diode 102 from V1; however, the forward voltage drop herein is ignored since it is not associated with the nature of the present invention.

When, with the bootstrap capacitance 200 charged, the voltage at the virtual voltage source 150H increases by ΔV2, the voltage at one end of the bootstrap capacitance 200 connected to the bootstrap diode 102 increases by ΔV2 to (V1+ΔV2). The bootstrap diode 102 is thus reverse biased and the current supply from the voltage source 150L to the positive power supply of the logic circuit 103 comes to a stop. At this time, the electric charge on the bootstrap capacitance 200 is supplied to the positive power supply of the logic circuit 103. That is, the voltage (V1+ΔV2) is applied to the positive power supply of the logic circuit 103 and the voltage (V2+ΔV2) is applied to the negative power supply. In this way the voltage (V1−V2) is supplied to the power supply of the logic circuit 103 at all times, which allows the logic circuit 103 to operate independent of the voltage from the virtual voltage source 150H. Here, the voltage provided by the voltage source 150L is, for example, several tens of volts, while the voltage provided by the virtual voltage source 150H (i.e., the voltage at the load) is between 0 V and several hundred volts, for example. That is, a reverse voltage of several hundred volts can be applied to the cathode of the bootstrap diode 102.

Figure 2B:
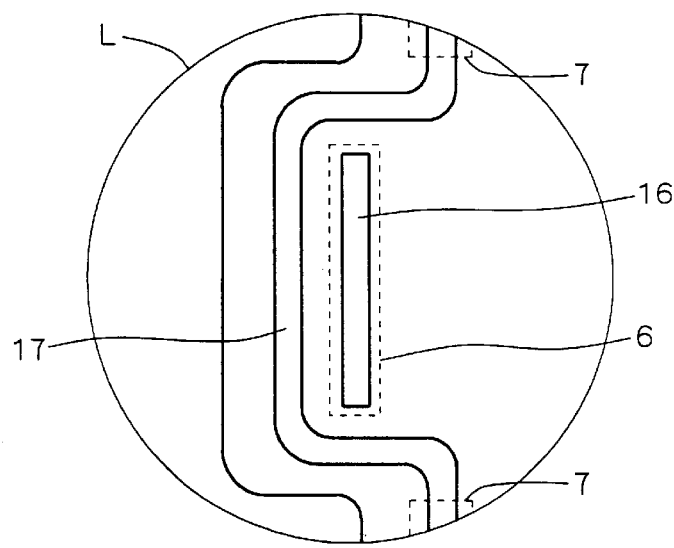
Figure 3:
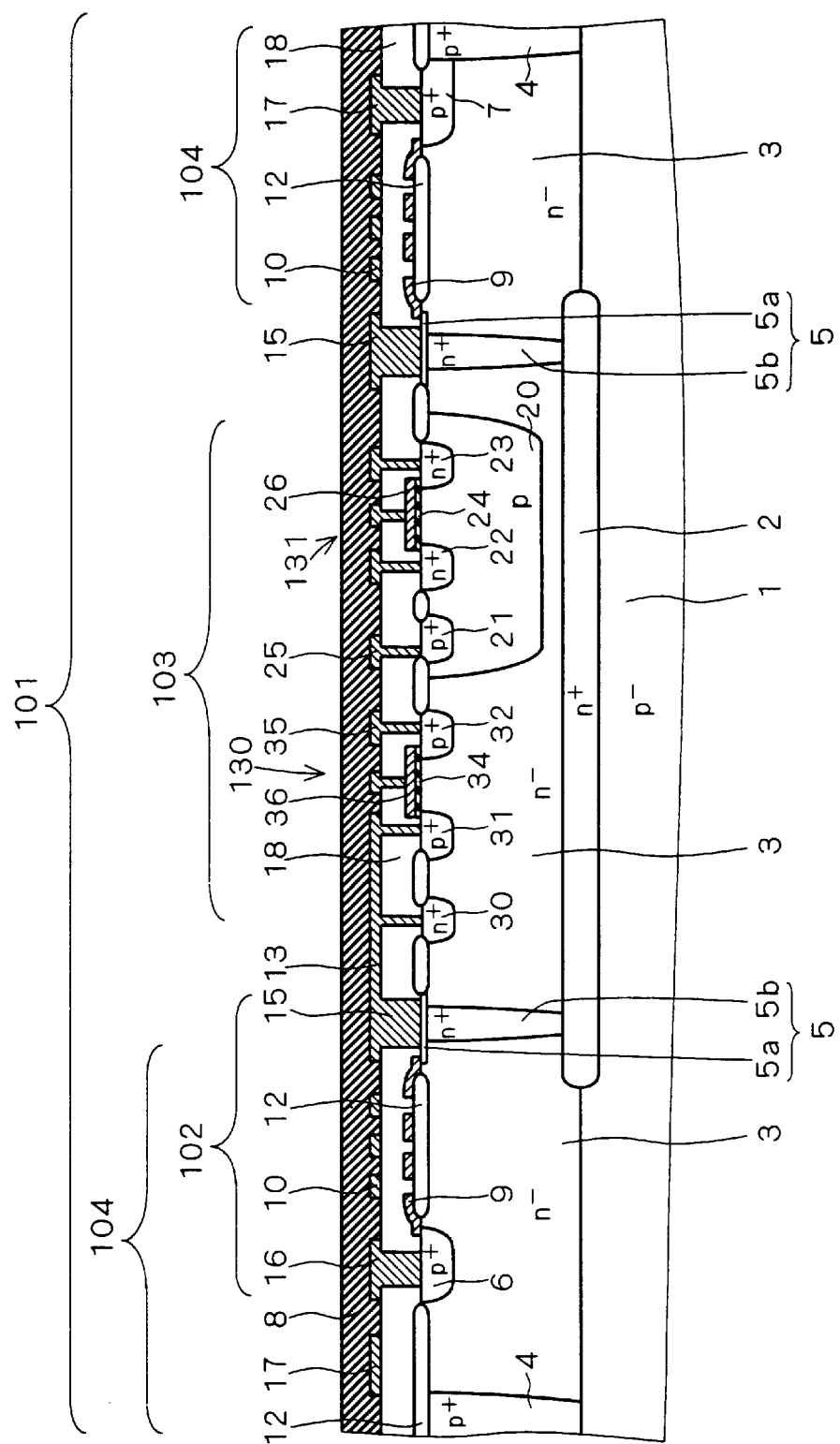
FIGS. 3 and 4 are schematic cross-sectional views of the configuration of the HVIC 100 according to the first preferred embodiment.
Figure 4:
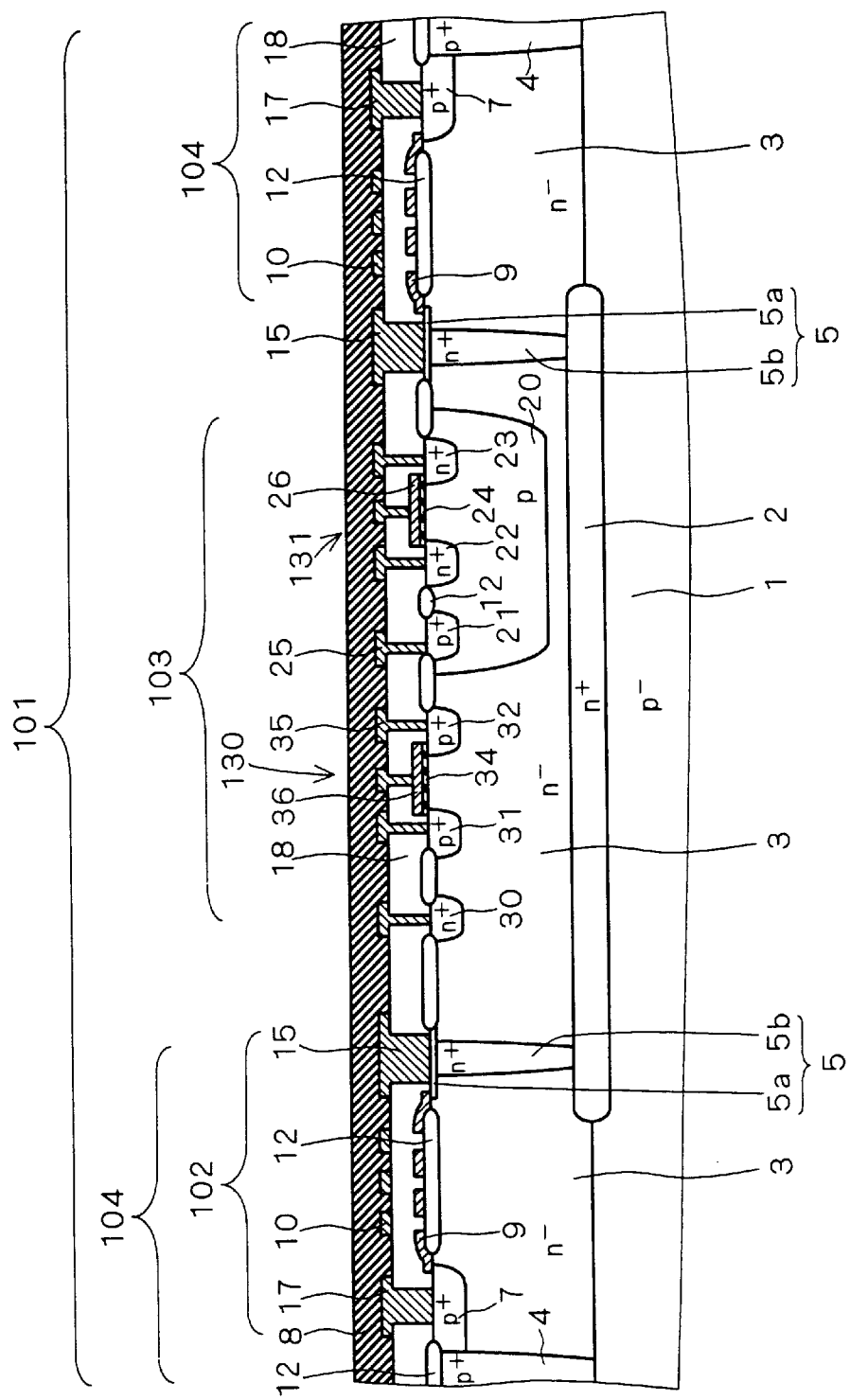

FIGS. 2A and 2B are schematic plan views of a configuration of the HVIC 100 according to the first preferred embodiment. FIG. 2A is a plan view of the whole HVIC 100 and FIG. 2B is an enlarged plan view of a portion L in FIG. 2A. FIG. 3 is a cross-sectional view taken along the line A—A indicated by the arrows in FIG. 2A and FIG. 4 is a cross-sectional view taken along the line B—B indicated by the arrows in FIG. 2A. To avoid the complexity of the drawings, an insulating film 8 of FIGS. 3 and 4 is not shown in FIGS. 2A and 2B, which show only a cathode and an anode electrodes 15, 16 of the bootstrap diode 102 and metal electrodes 13 and 17, out of the electrodes formed on an insulating film 18. The broken line indicating the bootstrap diode 102 and the oblique lines indicating an isolation region 104 in FIG. 2A are not shown in FIG. 2B.

In the HVIC 100 of the first preferred embodiment, as shown in FIGS. 2A, 2B, 3, and 4, an n$^-$ semiconductor layer 3 is formed on a p$^-$ semiconductor substrate 1. Extending from the surface of the n$^-$ semiconductor layer 3 to the interface between the n$^-$ semiconductor layer 3 and the p$^-$ semiconductor substrate 1, a p$^+$ impurity region 4 is formed in the n$^-$ semiconductor layer 3. The p$^+$ impurity region 4 is formed to surround part of the n$^-$ semiconductor layer 3 and forms a high-potential island region 101 where the logic circuit 103 and the bootstrap diode 102 are located.

At the interface between the n$^-$ semiconductor layer 3 and the p$^-$ semiconductor substrate 1 within the high-potential island region 101, an n$^+$ buried impurity region 2 is selectively formed apart from the p⁺ impurity region 4. The logic circuit 103 is formed in the surface of the n⁻ semiconductor layer 3 above the n⁺ buried impurity region 2.

The logic circuit 103 comprises, for example, a p-channel MOSFET 130 and an n-channel MOSFET 131. The p-channel MOSFET 130 has a p⁺ drain region 31, a p⁺ source region 32, and a gate electrode 36. The drain region 31 and the source region 32 are formed with predetermined spacing in the surface of the n⁻ semiconductor layer 3 and the gate electrode 36 is formed through a gate insulating film 34 on the n⁻ semiconductor layer 3 between the drain region 31 and the source region 32. Further in the surface of the n⁻ semiconductor layer 3, an n⁺ impurity region 30 is formed adjacent to the drain region 31 with an oxide film 12 in between.

The n-channel MOSFET 131 is located adjacent to the p-channel MOSFET 130 and formed in a p⁻ well region 20 in the n⁻ semiconductor layer 3. The n-channel MOSFET 131 has an n⁺ drain region 23, an n⁺ source region 22, and a gate electrode 26. The drain region 23 and the source region 22 are formed with predetermined spacing in the surface of the p⁻ well region 20 and the gate electrode 26 is formed through a gate insulating film 24 on the p⁻ well region 20 between the drain region 23 and the source region 22. Further in the surface of the p⁻ well region 20, a p⁺ impurity region 21 is formed adjacent to the source region 22 with the oxide film 12 in between.

The locations of the p-channel MOSFET 130 and the n-channel MOSFET 131 are interchangeable. That is, the n-channel MOSFET 131 may be located closer to the bootstrap diode 102 than the p-channel MOSFET 130.

A p⁺ impurity region 6, which is an anode region of the bootstrap diode 102, is formed in the surface of the n⁻ semiconductor layer 3 above the interface of the p⁻ semiconductor substrate 1 and the n⁻ semiconductor layer 3 between the p⁺ impurity region 4 and the n⁺ buried impurity region 2. An n⁺ impurity region 5, which is a cathode region of the bootstrap diode 102, is formed in the n⁻ semiconductor layer 3 between and apart from the p⁺ impurity region 6 and the logic circuit 103. More specifically, the n⁺ impurity region 5 extending from the surface of the n⁻ semiconductor layer 3 to the n⁺ buried impurity region 2 is formed near the end portion of the n⁺ buried impurity region 2, to surround the logic circuit 103. The n⁺ impurity region 5 includes n⁺ impurity regions 5a and 5b. The n⁺ impurity region 5a is formed in the surface of the n⁻ semiconductor layer 3 and connected to the cathode electrode 15 which will be later described. The n⁺ impurity region 5b is connected to the n⁺ impurity region 5a and extends to the n⁺ buried impurity region 2.

In the surface of the n⁻ semiconductor layer 3 between the n⁺ impurity region 5 and the p⁺ impurity region 6, the oxide film 12 is selectively formed, on which an electrode 9 is formed to surround the n⁺ impurity region 5 and the logic circuit 103. This electrode 9 forms a multiple field plate for improved breakdown voltage. The electrode 9 as well as the gate electrode 26 are made of polysilicon, for example.

In the surface of the n⁻ semiconductor layer 3 between the n⁺ impurity region 5 and the p⁺ impurity region 4, a p⁺ impurity region 7 is formed in connection with the p⁺ impurity region 4. As shown in FIG. 2B, the p⁺ impurity region 7 extends to the vicinity of a region where the p⁺ impurity region 6 is formed, to surround the n⁺ impurity region 5 and the logic circuit 103.

The insulating film 18 is formed to cover the n⁻ semiconductor layer 3, the oxide film 12, the gate electrodes 26 and 36, and the electrode 9. Through the insulating film 18, the anode electrode 16 is connected to the p⁺ impurity region 6, the cathode electrode 15 to the n⁺ impurity region 5, and the metal electrode 17 to the p⁺ impurity region 7. A metal electrode 35 is connected through the insulating film 18 to the drain region 31, the source region 32, and the gate electrode 36 of the p-channel MOSFET 130 and to the n⁺ impurity region 30. A metal electrode 25 is connected through the insulating film 18 to the drain region 23, the source region 22, and the gate electrode 26 of the n-channel MOSFET 131 and to the p⁺ impurity region 21.

The cathode electrode 15 is located to surround the logic circuit 103 along the n⁺ impurity region 5 to which the cathode electrode 15 itself is connected. The cathode electrode 15 is connected to the metal electrode 35 on the drain region 31 and the n⁻ impurity region 30 by the metal electrode 13 of aluminum, for example. This provides connection for the cathode of the bootstrap diode 102 and the logic circuit 103 as shown in FIG. 1. On the side of the anode electrode 16 opposite the logic circuit 103, the metal electrode 17 is formed to surround the logic circuit 103 and the cathode electrode 15 along the p⁺ impurity region 7 to which the metal electrode 17 itself is connected.

A floating metal electrode 10 is located on the insulating film 18 above the electrode 9 and its capacitive coupling to the electrode 9 improves the breakdown voltage. The insulating film 8 is formed on the insulating film 18 to cover the respective electrodes.

Figure 5:
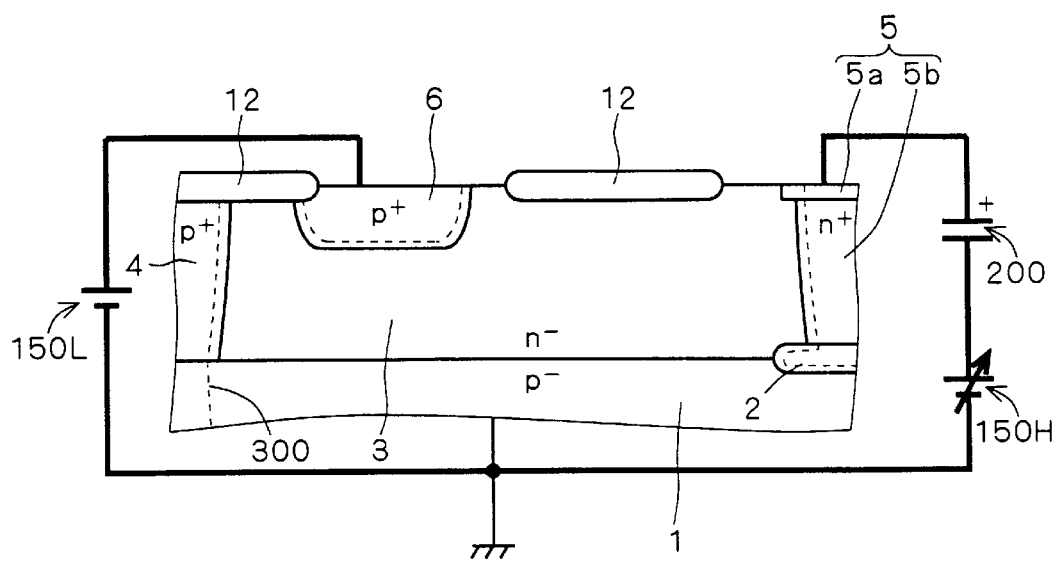
FIG. 5 illustrates how an n⁻ semiconductor layer 3 is covered with a depletion layer in the HVIC 100 according to the first preferred embodiment.

Next, the isolation region 104 of FIG. 2A will be set forth. The logic circuit 103 is surrounded by the p⁺ impurity region 4 and the n⁻ impurity region 5. The n⁻ semiconductor layer 3 between the p⁺ impurity region 4 and the n⁺ impurity region 5 is covered with a depletion layer due to the RESURF effect. That is, the logic circuit 103 is surrounded by the depletion layer. FIG. 5 illustrates how the n⁻ semiconductor layer 3 is covered with a depletion layer due to the RESURF effect, the broken line 300 indicating the outline of the depletion layer formed. To avoid the complexity of the drawing, the anode electrode 16, the cathode electrode 15, the electrode 9, the metal electrodes 10 and 17, and the insulating films 8 and 18 are not shown.

For example, the p⁻ semiconductor substrate 1 is connected to a ground potential. The p⁺ impurity region 4 connected to the p⁻ semiconductor substrate 1 accordingly bears the ground potential. Since, as above described, the anode of the bootstrap diode 102 is connected for example to the voltage source 1501, a positive potential is applied to the p⁺ impurity region 6. On the other hand, since the cathode of the bootstrap diode 102 is connected through the bootstrap capacitance 200 to the virtual voltage source 150H, a positive potential is applied to the n⁺ impurity region 5. The n⁺ impurity region 5 is connected to the n⁻ semiconductor layer 3 and the n⁺ buried impurity region 2; therefore, a positive potential is applied to those regions. In this way, a reverse voltage is applied to a pn junction formed of the p-type and n-type regions. A resultant RESURF effect leads to the formation of a depletion layer across the whole n⁻ semiconductor layer 3 between the p⁺ impurity region 4 and the n⁺ impurity region 5. The isolation region 104 refers to a region where the depletion layer is formed. As shown in FIG. 2A, the HVIC 100 according to the first preferred embodiment achieves a high breakdown voltage by covering the logic circuit 103 with the isolation region 104, i.e., with the depletion layer.

As above described, the HVIC 100 of the first preferred embodiment comprises the bootstrap diode 102 and the logic circuit 103 formed in the high-potential island region 101 surrounded by the p+ impurity region 4. The metal electrode 13 to which a high voltage of several hundred volts is applied, therefore, does not pass over the p+ impurity region 4 in connecting the bootstrap diode 102 and the logic circuit 103. Consequently, nothing will inhibit the spread of a depletion layer in the n− semiconductor layer caused by the RESURF effect. That is, the breakdown voltage which has been ensured in the early design stage can be maintained.

While the bootstrap diode 102 and the logic circuit 103 in the conventional HVIC 110 are formed in the two regions which are depleted by the RESURF effect, the HVIC 100 of the first preferred embodiment utilizes part of the isolation region 104 which surrounds the logic circuit 103 for the formation of the bootstrap diode 102 and therefore, can achieve a reduction in area as compared with the conventional HVIC 110.

While extending to the n+ buried impurity region 2 in the first preferred embodiment, the n+ impurity region 5 may be formed shallower, like the p+ impurity region 6. In the first preferred embodiment, the n+ impurity region 5 limits the spread of the depletion layer in the n− semiconductor layer 3, thereby to prevent the depletion layer from spreading to the region where the logic circuit 103 is formed. If the n+ impurity region 5 is formed shallower as above described, the effect of limiting the spread of the depletion layer is lessened. However, controlling the concentration and thickness of the n− semiconductor layer 3 allows the formation of the same isolation region 104 as in the first preferred embodiment, which can prevent the spread of a depletion layer to the region where the logic circuit 103 is formed. While the n+ impurity region 5 is formed to surround the logic circuit 103, it may be formed partially, like the p+ impurity region 6. The conductivity types (p- or n-type) of impurities in the respective regions are interchangeable.

Figure 6:
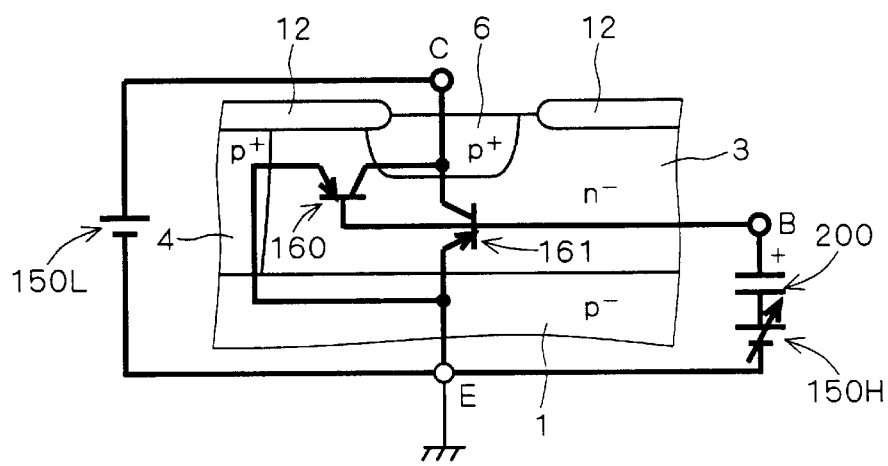
FIG. 6 shows parasitic bipolar transistors formed in the HVIC 100 according to the first preferred embodiment.

In the HVIC 100 according to the first preferred embodiment, a parasitic bipolar transistor is formed to influence breakdown voltage performance. FIG. 6 shows parasitic bipolar transistors formed in the HVIC 100 according to the first preferred embodiment. To avoid the complexity of the drawing, the anode electrode 16, the electrode 9, the metal electrodes 10 and 17, and the insulating films 8 and 18 are not shown.

The p+ impurity region 4 forms a pnp parasitic bipolar transistor 160 in conjunction with the n− semiconductor layer 3 and the p+ impurity region 6. The p− semiconductor substrate 1 forms a pnp parasitic bipolar transistor 161 in conjunction with the n− semiconductor layer 3 and the p+ impurity region 6. These pnp parasitic bipolar transistors are connected in parallel. More specifically, the pnp parasitic bipolar transistors are formed such that the p− semiconductor substrate 1 and the p+ impurity region 4 serve as their respective emitters, the p+ impurity region 6 as their collector, and the n− semiconductor layer 3 as their base. The pnp parasitic bipolar transistors can ensure several hundred volts of base-emitter and base-collector breakdown voltages since the n− semiconductor layer 3 as a base is totally covered with a depletion layer due to the RESURF effect.

The emitter-collector breakdown voltage, however, is determined by the depth of the p+ impurity region 6 in a direction to the p− semiconductor substrate 1 and the distance between the p+ impurity regions 6 and 4. More specifically, the shorter distance between the p+ impurity regions 6 and 4 results in the lower emitter-collector breakdown voltage of the pnp parasitic bipolar transistor 160. Further, the emitter-collector breakdown voltage of the pnp parasitic bipolar transistor 161 is reduced as the p+ impurity region 6 becomes closer to the p− semiconductor substrate 1. Such an emitter-collector breakdown voltage reduction across the respective parasitic bipolar transistor results in a reduction in the breakdown voltage of the whole HVIC. Therefore, it is more desirable that the depth of the p+ impurity region 6 in the direction to the p− semiconductor substrate 1 and the distance between the p+ impurity regions 6 and 4 should be determined to provide a desired emitter-collector breakdown voltage.

Second Preferred Embodiment

Figure 7A:
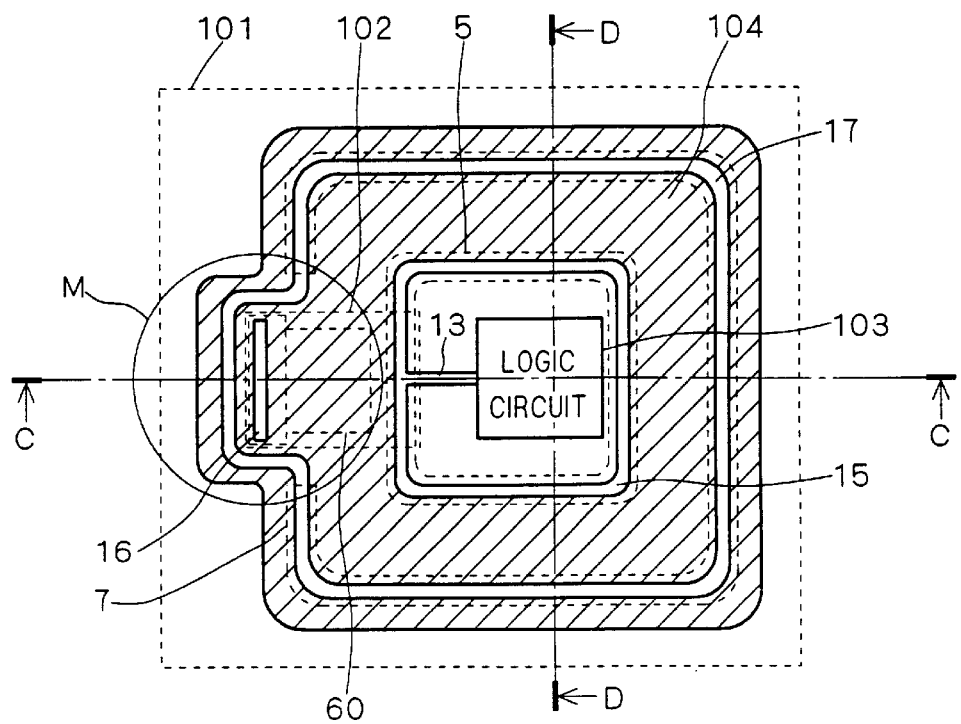
FIGS. 7A and 7B are schematic plan views of a configuration of an HVIC according to a second preferred embodiment.
Figure 7B:
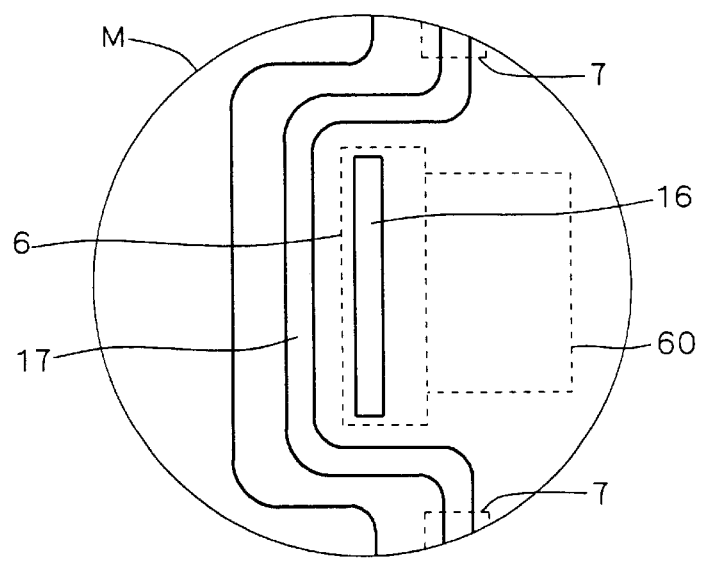
Figure 8:
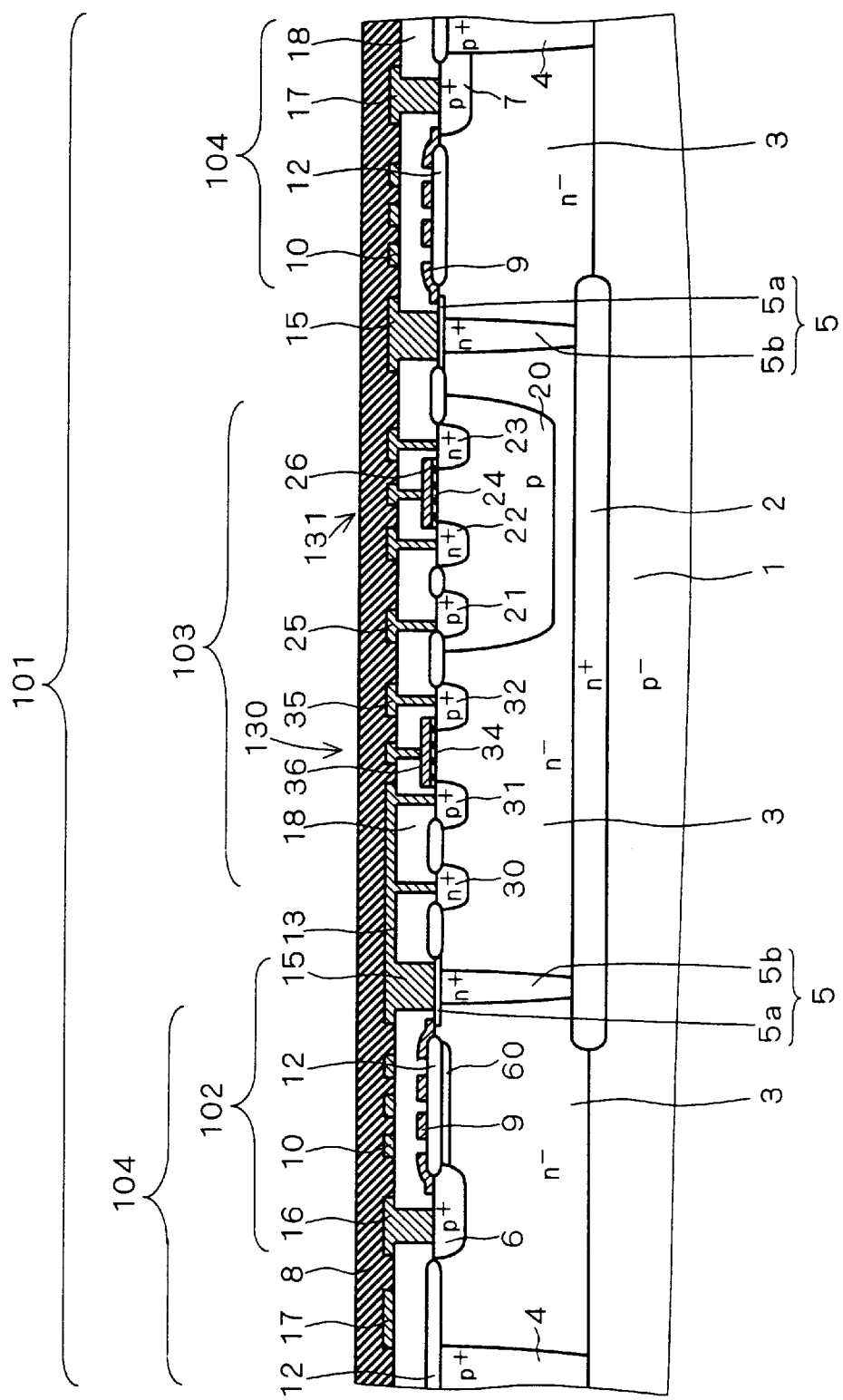
FIGS. 8 and 9 are schematic cross-sectional views of the configuration of the HVIC according to the second preferred embodiment.
Figure 9:
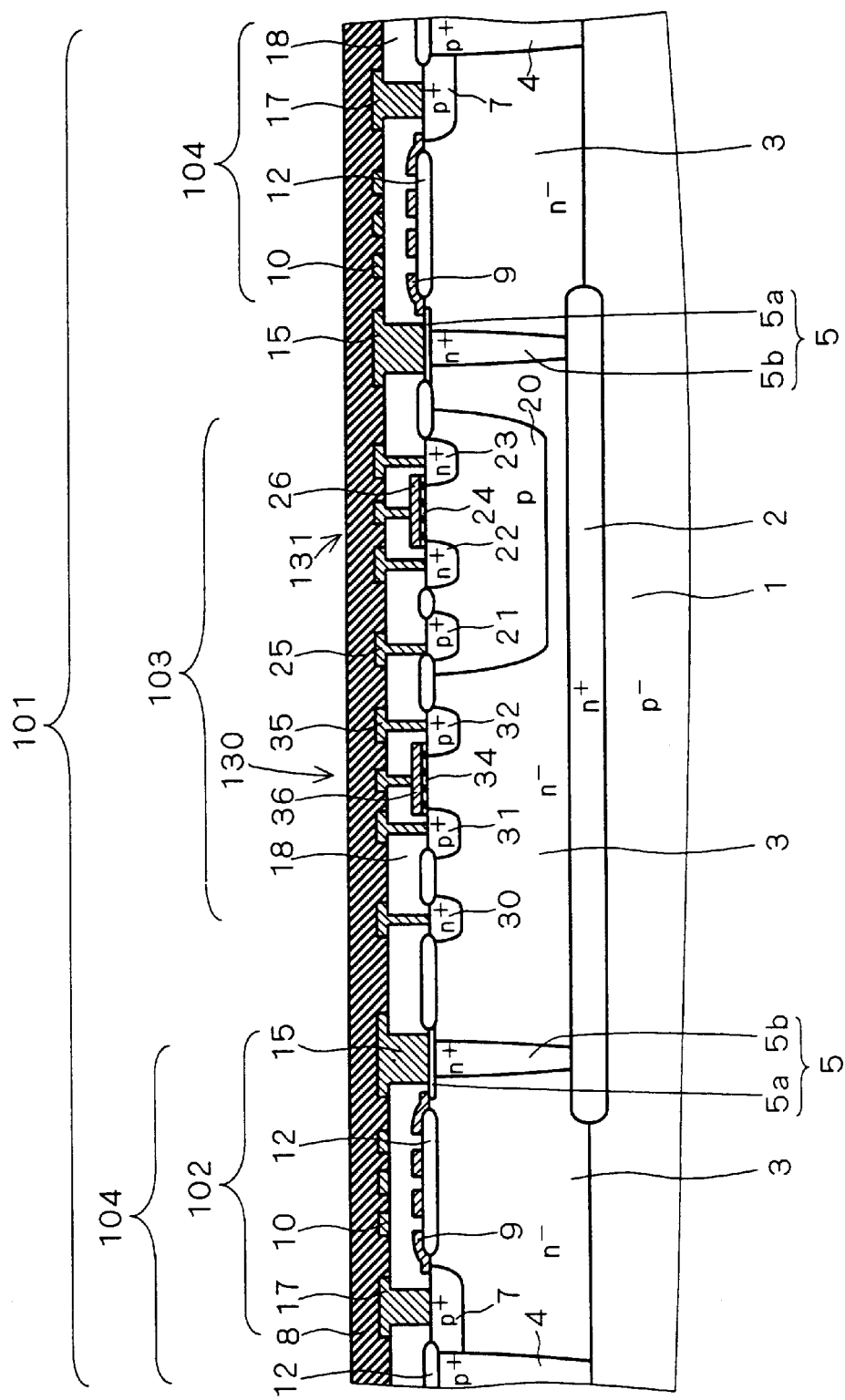

FIGS. 7A and 7B are schematic plan views of a configuration of an HVIC according to a second preferred embodiment of the present invention. FIG. 7A is a plane view of the whole HVIC according to the second preferred embodiment, and FIG. 7B is an enlarged plan view of a portion M in FIG. 7A. FIG. 8 is a cross-sectional view taken along the line C—C indicated by the arrows in FIG. 7A, and FIG. 9 is a cross-sectional view taken along the line D—D indicated by the arrows in FIG. 7A. The HVIC according to the second preferred embodiment is a modification of the HVIC 100 of the aforementioned first preferred embodiment which further comprises a p− impurity region 60. The broken line indicating the bootstrap diode 102 and the oblique lines indicating the isolation region 104 are not shown in FIG. 7B.

As shown in FIGS. 7A, 7B, 8 and 9, the p− impurity region 60 is formed in the surface of the n− semiconductor layer 3. It is connected to the p+ impurity region 6 which is the anode region of the bootstrap diode 102, and extends toward the n+ impurity region 5 which is the cathode region of the bootstrap diode 102.

Figure 10:
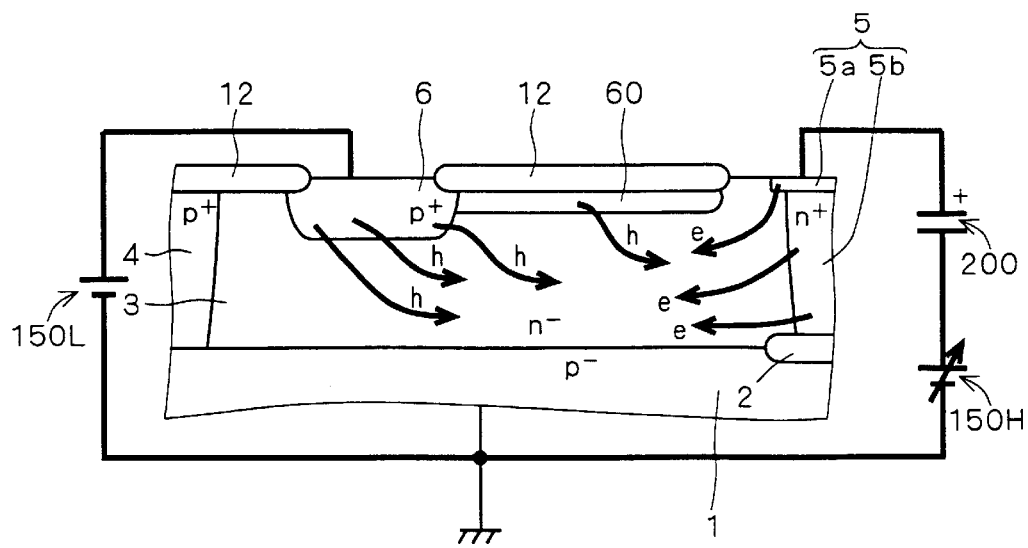
FIGS. 10 and 11 illustrate the motions of holes and electrons in the HVIC according to the second preferred embodiment.
Figure 11:
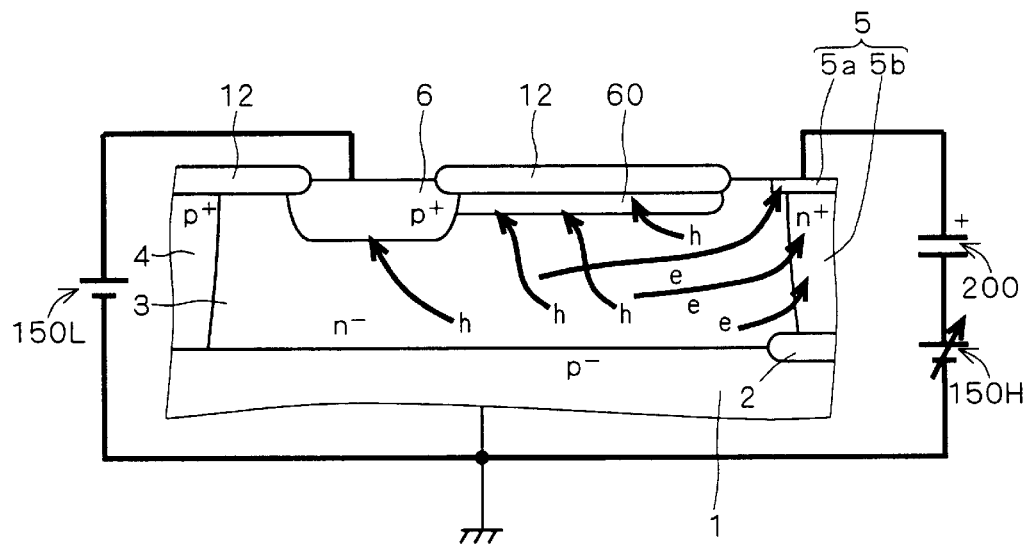

The HVIC with the above configuration according to the second preferred embodiment can shorten a recovery operating time for the bootstrap diode 102. FIG. 10 illustrates the motions of holes and electrons when a forward voltage is applied to the bootstrap diode 102, and FIG. 11 illustrates the motions of holes and electrons when the voltage applied to the bootstrap diode 102 is switched from forward to reverse. To avoid the complexity of the drawings, the anode electrode 16, the cathode electrode 15, the electrode 9, the metal electrodes 10 and 17, and the insulating films 8 and 18 are not shown in FIGS. 10 and 11.

As shown in FIG. 10, when a voltage applied to the p+ impurity region 6 which is an anode region is greater than that applied to the n+ impurity region 5 which is a cathode region, i.e., when the forward voltage is applied to the bootstrap diode 102, holes h from the p+ impurity region 6 and the p− impurity region 60 and electrons e from the n+ impurity region 5 are injected into the n− semiconductor layer 3. This causes a current flow through the bootstrap diode 102.

As shown in FIG. 11, when the voltage applied to the n+ impurity region 5 is greater than that applied to the p+ impurity region 6, i.e., when a reverse voltage is applied to the bootstrap diode 102, a depletion layer is formed in the n− semiconductor layer 3 and the holes h existing in the n− semiconductor layer 3 are brought back to the p+ impurity region 6 and the p− impurity region 60 and the electrons e to the n+ impurity region 5. Until the completion of the movements of the holes h and the electrons e, a reverse current, called a tail current, flows through the bootstrap diode 102. The time until no tail current flows is called a recovery operating time.

FIG. 12 illustrates recovery properties of the bootstrap diode 102. The horizontal axis t shows the time and the vertical axis I shows the current flowing through the bootstrap diode 102, where a forward current is positive. The solid line in the drawing indicates the recovery properties of the HVIC according to the second preferred embodiment, while the broken line indicates the recovery properties of the HVIC 100 according to the aforementioned first preferred embodiment. In the drawing, t1 and t2 indicate the recovery operating times for the second and first preferred embodiments, respectively.

Since, in the second preferred embodiment, the $p^-$ impurity region 60 extends toward the $n^+$ impurity region 5, the time during which the holes h existing in the vicinity of the $n^+$ impurity region 5 are drawn back is shorter than that for the first preferred embodiment. Thus, as shown in FIG. 12, the recovery operating time t1 for the second preferred embodiment is shorter than the recovery operation time t2 for the first preferred embodiment, which achieves the bootstrap diode 102 with good recovery properties.

Use of a well-known RESURF technique leads to the formation of a depletion layer across the whole $p^-$ impurity region 60, thereby improving the breakdown voltage in the vicinity of the surface of the $n^-$ semiconductor layer 3.

Third Preferred Embodiment

FIG. 13 is a schematic plan view of a configuration of an HVIC according to a third preferred embodiment of the present invention. The HVIC of the third preferred embodiment is a modification of the HVIC 100 of the aforementioned first preferred embodiment in which the $p^+$ impurity region 6 and the $n^+$ impurity region 5 are opposed to each other along a bent portion of the $p^+$ impurity region 4 which forms the high-potential island region 101. The anode electrode 16 and the cathode electrode 15 are located respectively on the $p^+$ impurity region 6 and the $n^+$ impurity region 5.

The broken line 160 in the drawing indicates the outline of the $p^+$ impurity region 4 on the side of the logic circuit 103. The other components of the configuration are identical to those of the HVIC 100 according to the aforementioned first preferred embodiment and thus the description thereof will be omitted.

Figure 14:
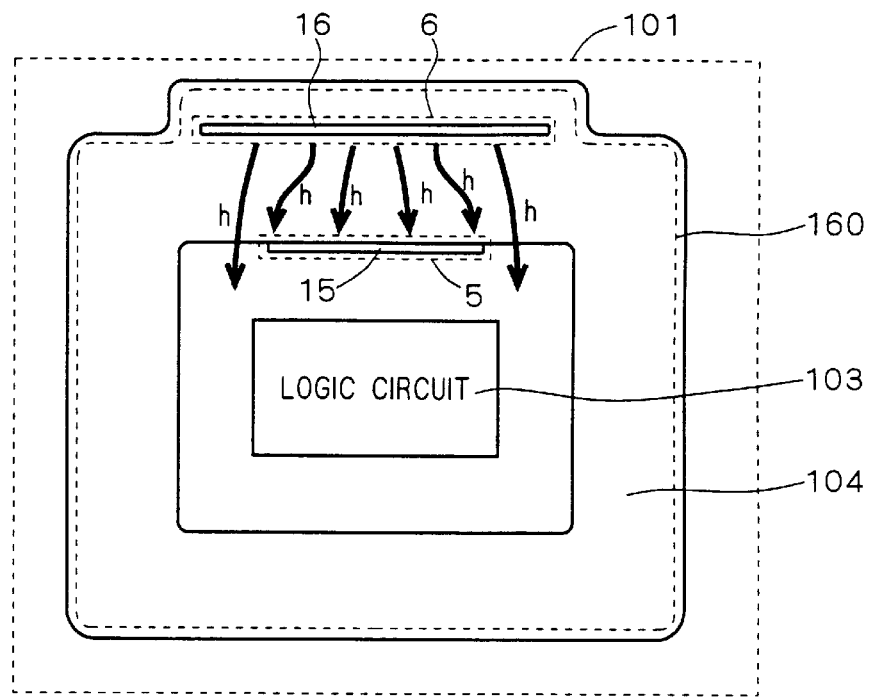
FIG. 14 is an explanatory diagram for the advantages of the HVIC according to the third preferred embodiment.

FIG. 14 is an explanatory diagram for the advantages of the HVIC according to the third preferred embodiment, which schematically shows a configuration of the HVIC when the $p^+$ impurity region 6 and the $n^+$ impurity region 5 are formed along a straight portion of the $p^+$ impurity region 4. In both FIGS. 13 and 14, the $p^+$ impurity region 6 which is an anode region is larger in area than the $n^+$ impurity region 5 in order to inhibit a forward voltage drop across the bootstrap diode 102.

As shown in FIG. 14, when the $p^+$ impurity region 6 and the $n^+$ impurity region 5 are opposed to each other along a straight portion of the $p^+$ impurity region 4, the holes h moving from the $p^+$ impurity region 6 toward the $n^+$ impurity region 5 are easy to enter the region where the logic circuit 103 is formed. This can destabilize the operations of the logic circuit 103.

In the HVIC according to the third preferred embodiment, on the other hand, the $p^+$ impurity region 6 and the $n^+$ impurity region 5 are opposed to each other along a bent portion of the $p^+$ impurity region 4. Thus, even if the $p^+$ impurity region 6 has an area the same size as the one shown in FIG. 14 in order to inhibit a forward voltage drop across the bootstrap diode 102, the amount of holes h which enter the region where the logic circuit 103 is formed can be reduced. This reduces unstable operations of the logic circuit 103.

Fourth Preferred Embodiment

Figure 15:
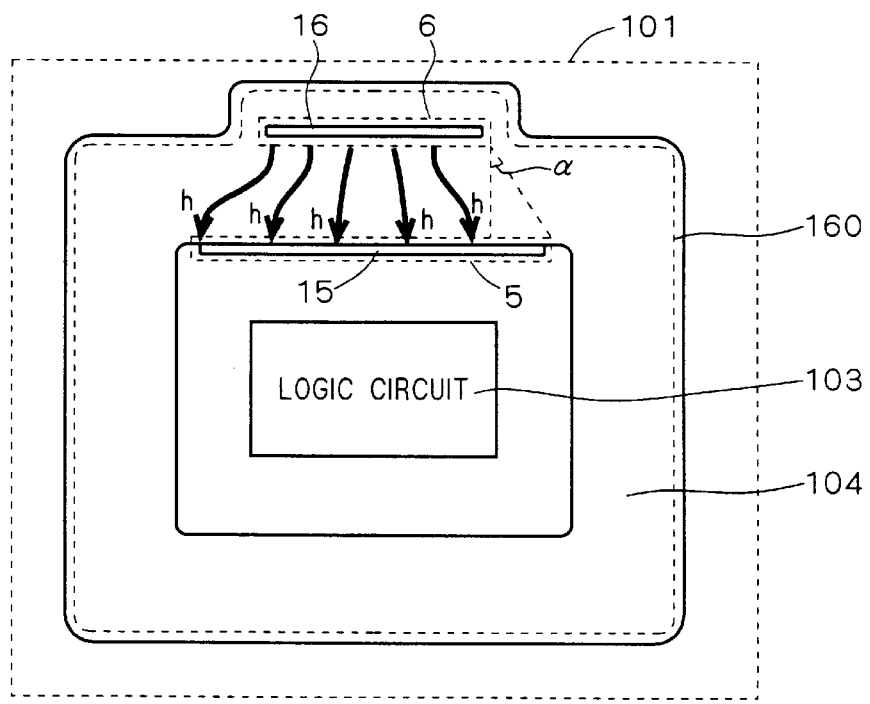
FIGS. 15 and 16 are schematic plan views of a configuration of an HVIC according to a fourth preferred embodiment.
Figure 16:
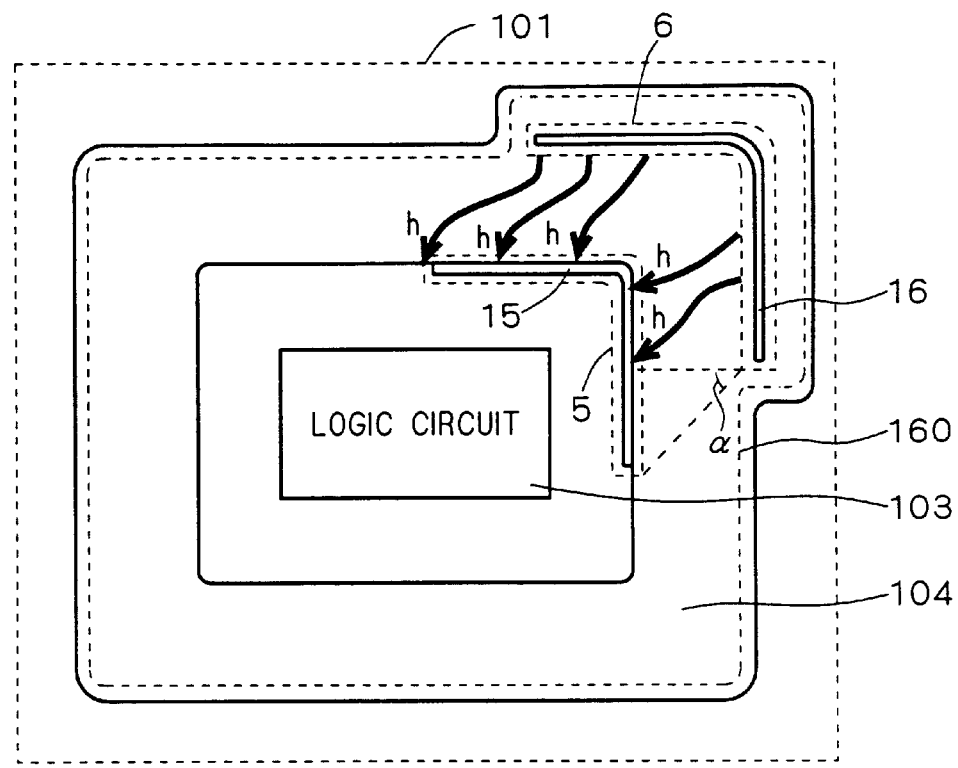

FIGS. 15 and 16 are schematic plan views of a configuration of an HVIC according to a fourth preferred embodiment of the present invention. As shown in FIGS. 15 and 16, the HVIC of the fourth preferred embodiment is a modification of the HVIC 100 of the aforementioned first preferred embodiment in which the $p^+$ impurity region 6 and the $n^+$ impurity region 5 are opposed to each other along the $p^+$ impurity region 4 and the $n^+$ impurity region 5 is longer in length than the $p^+$ impurity region 6 along the surface of the $n^-$ semiconductor layer 3. The anode electrode 16 is formed on the $p^+$ impurity region 6 and the cathode electrode 15 on the $n^+$ impurity region 5.

In the HVIC of the fourth preferred embodiment shown in FIG. 15, the $p^+$ impurity region 6 and the $n^+$ impurity region 5 are formed along a straight portion of the $p^+$ impurity region 4. In the HVIC of the fourth preferred embodiment shown in FIG. 16, the $p^+$ impurity region 6 and the $n^+$ impurity region 5 are formed along a bent portion of the $p^+$ impurity region 4. The other components of the configurations are identical to those of the HVIC 100 of the aforementioned first preferred embodiment and thus the description thereof will be omitted.

Application of a forward voltage to the bootstrap diode 102 causes the holes h in the $p^+$ impurity region 6 to move through the $n^-$ semiconductor layer 3 toward the $n^-$ impurity region 5. At this time, the holes h spread on the outer side of $p^+$ impurity region 6 to move toward the $n^+$ impurity region 5. Some of the holes h will thus enter the region where the logic circuit 103 is formed without being drawn into the $n^+$ impurity region 5, which can destabilize the operations of the logic circuit 103. In the HVIC according to the fourth preferred embodiment, on the other hand, since the $n^+$ impurity region 5 opposed to the $p^+$ impurity region 6 is longer in length than the $p^+$ impurity region 6 along the surface of the $n^-$ semiconductor layer 3, a larger amount of holes h from the $p^+$ impurity region 6 can be drawn into the $n^+$ impurity region 5. This reduces unstable operations of the logic circuit 103.

Moreover, as shown in FIGS. 15 and 16, the $p^+$ impurity region 6 and the $n^-$ impurity region 5 are formed such that a straight line from the end portion of the $p^+$ impurity region 6 to the end portion of the $n^+$ impurity region 5 and a vertical line from the end portion of the $p^+$ impurity region 6 to the opposing surface of the $n^+$ impurity region 5 form an angle α. By forming the $p^+$ impurity region 6 and the $n^+$ impurity region 5 so that this value of angle α becomes 45 degrees or more, most of the holes h can be drawn into the $n^+$ impurity region 5. This results in a further reduction in unstable operations of the logic circuit 103.

Fifth Preferred Embodiment

Figure 17:
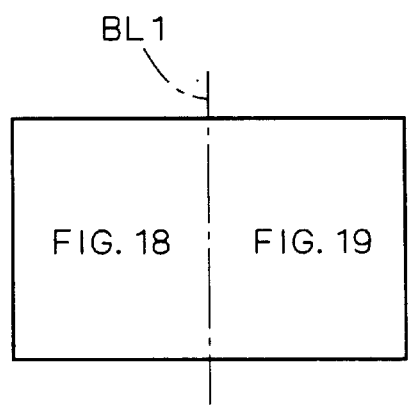
FIG. 17 is an explanatory diagram for the arrangement of FIGS. 18 and 19.
Figure 18:
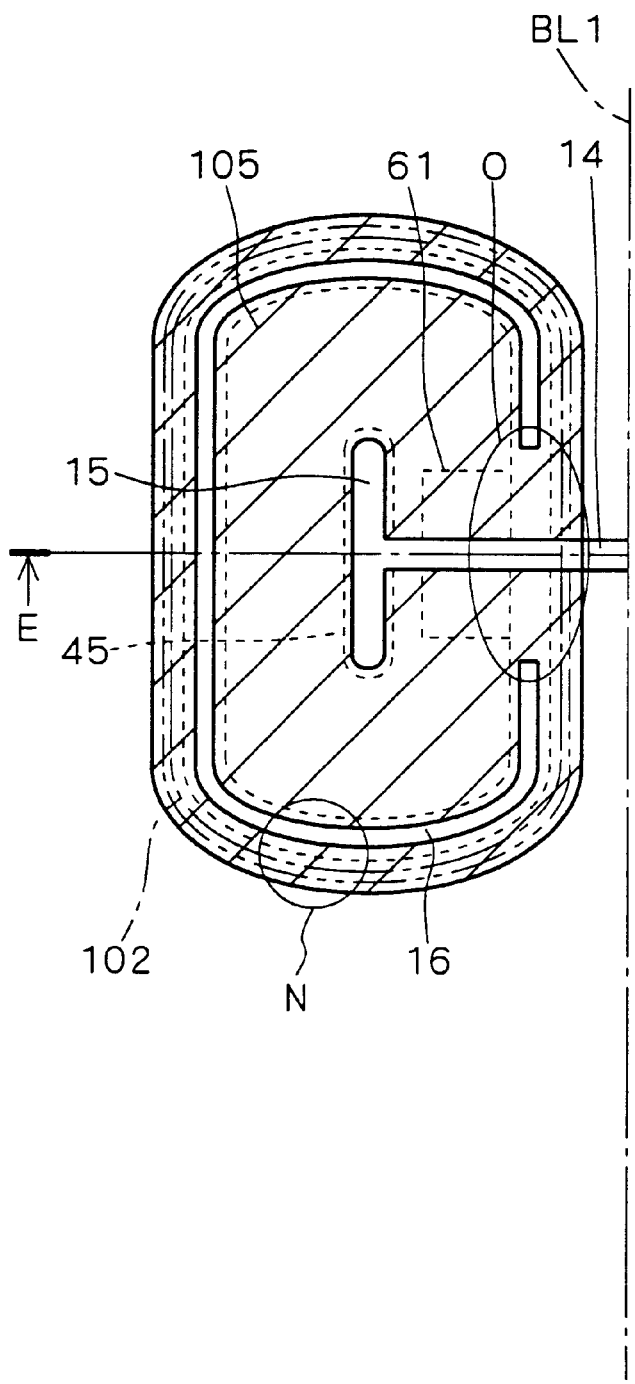
FIGS. 18 and 19 are schematic plan views of a configuration of an HVIC according to a fifth preferred embodiment.
Figure 19:
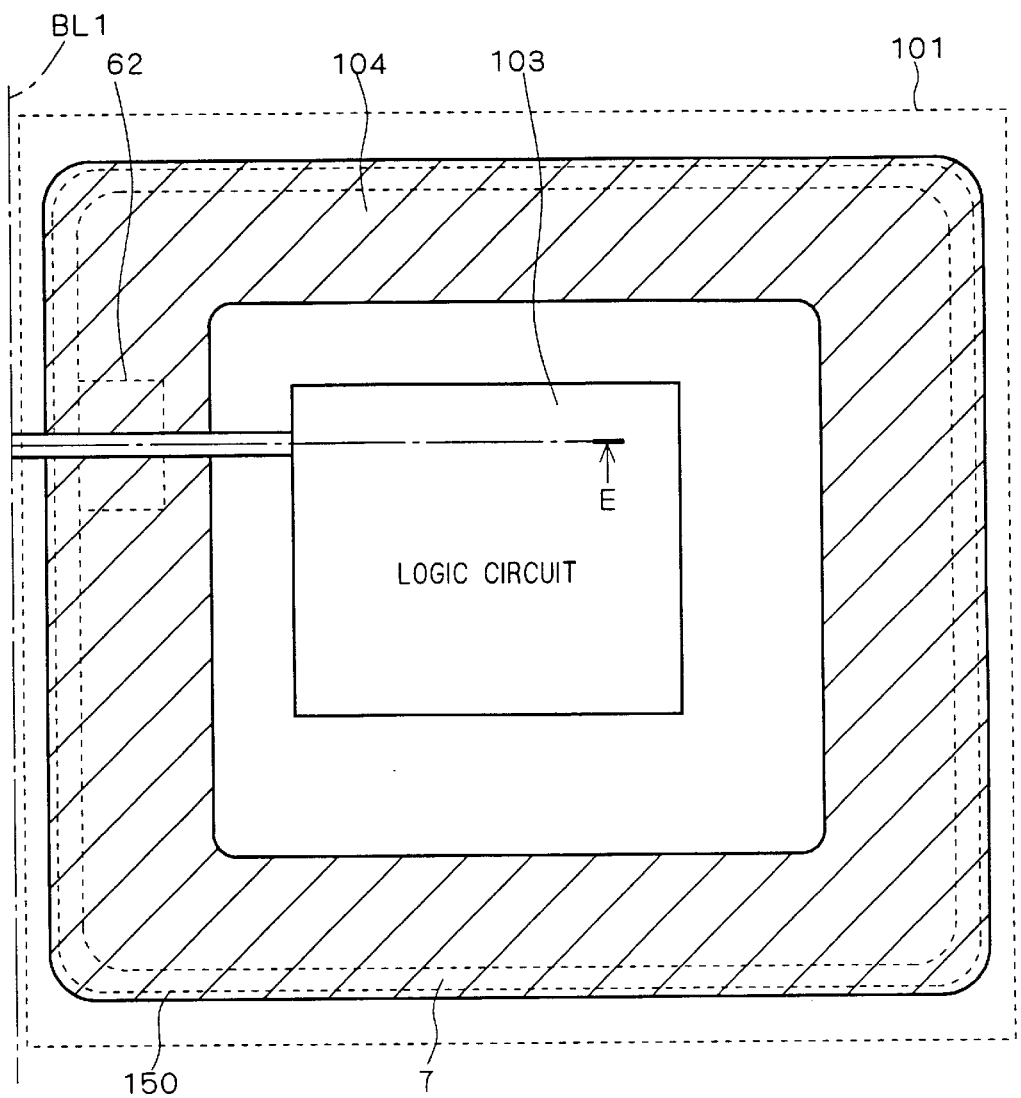
Figure 20:
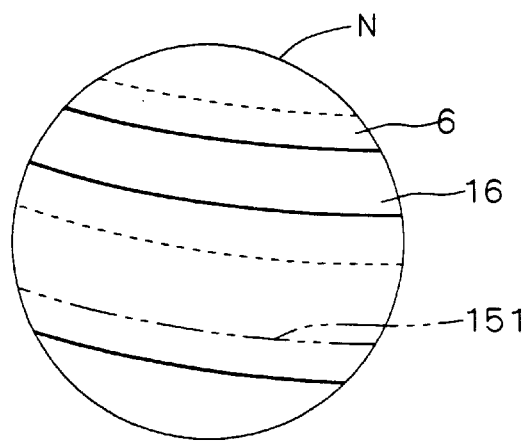
FIGS. 20 and 21 are enlarged plan views of the configuration of the HVIC according to the fifth preferred embodiment.
Figure 21:
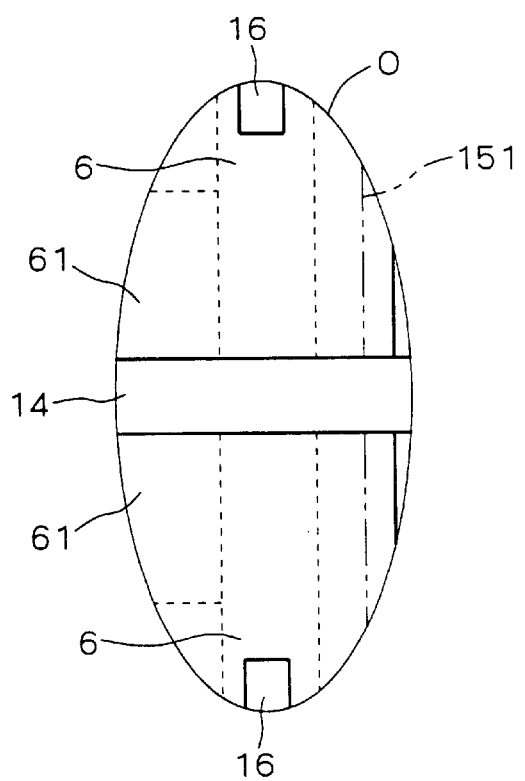
Figure 22:
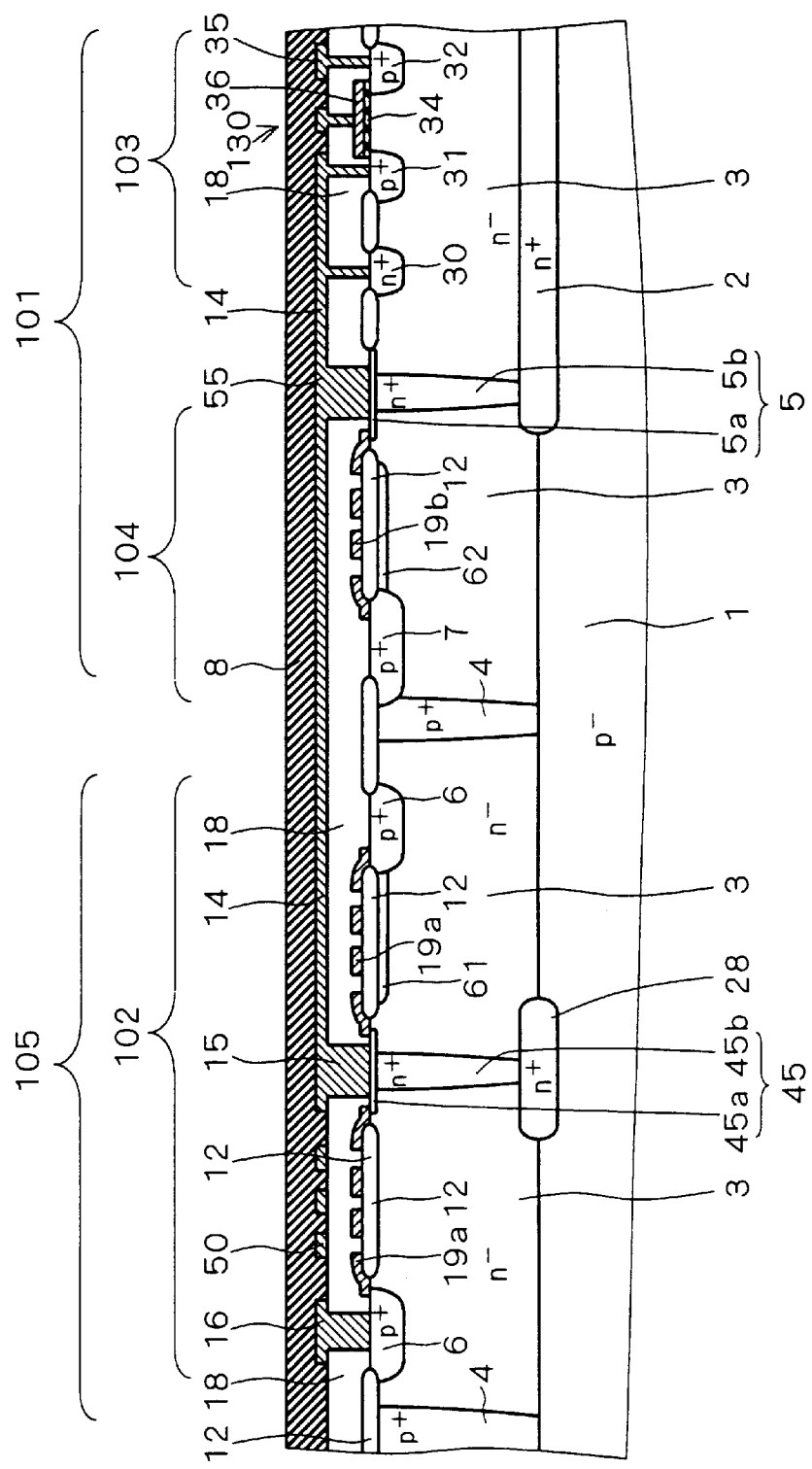
FIG. 22 is a schematic cross-sectional view of the configuration of the HVIC according to the fifth preferred embodiment.

FIGS. 17 through 22 show an HVIC according to a fifth preferred embodiment of the present invention. FIG. 17 is an explanatory diagram for the arrangement of FIGS. 18 and 19, FIGS. 18 and 19 are schematic plan views of a configuration of the HVIC according to the fifth preferred embodiment, FIG. 20 is an enlarged plan view of a portion N in FIG. 18, and FIG. 21 is an enlarged plan view of a portion 0 in FIG. 18. FIG. 22 is a cross-sectional view taken along the line E—E indicated by the arrows in FIGS. 18 and 19. The HVIC according to the fifth preferred embodiment is a modification of the aforementioned conventional HVIC 110 which further comprises $p^-$ impurity regions 61 and 62 below the metal electrode 14. The dash-dotted line indicating the bootstrap diode 102 in FIG. 18 and the oblique lines indicating the region 105 are not shown in FIGS. 20 and 21.

As shown in FIGS. 17 to 22, the p⁻ impurity region 61 is connected to the p⁺ impurity region 6 located below the metal electrode 14 and is formed in the surface of the n⁻ semiconductor layer 3 below the metal electrode 14. The p⁻ impurity region 62 is connected to the p⁺ impurity region 7 located below the metal electrode 14 and is formed in the surface of the n⁻ semiconductor layer 3 below the metal electrode 14. The p⁺ impurity region 7 is connected to the p⁺ impurity region 4, and like the p⁺ impurity region 4, it is formed to surround the logic circuit 103; therefore, the p⁺ impurity region 7 and the p⁺ impurity region 4 can be considered as a unitary region. That is, the p⁻ impurity region 62 can be considered to be connected to the p⁺ impurity region 4 and located below the metal electrode 14. The broken line 150 in FIG. 19 indicates the outline of the p⁺ impurity region 4 which forms the isolation region 104 on the side of the logic circuit 103, and the two-dot chain line 151 in FIGS. 18, 20, and 21 indicates the outline of the p⁺ impurity region 4 which forms the region 105 on the side of the bootstrap diode 102. The other components of the configuration are identical to those of the aforementioned conventional HVIC 110 and thus the description thereof will be omitted.

In the conventional HVIC 110, the metal electrode 14 to which, for example, a high voltage of several hundred volts is applied is located on the p⁺ impurity region 4. This poses a problem of inhibition of the spread of a depletion layer in the n⁻ semiconductor layer 3 and reduction in the breakdown voltage. The depletion layer is especially hard to spread in the surface of the n⁻ semiconductor layer 3 below the metal electrode 14. In the HVIC according to the fifth preferred embodiment, on the other hand, the formation of the p⁻ impurity regions 60 and 61 below the metal electrode 14 allows the formation of a depletion layer to an extent to the vicinity of the surface of the n⁻ semiconductor layer 3 below the metal electrode 14, if a reverse voltage is applied to the bootstrap diode 102. Also, use of a well-known RESURF technique allows the formation of a depletion layer in the whole p⁻ impurity regions 61 and 62. From this, breakdown voltage reduction due to the influence of the metal electrode 14 can be minimized.

Figure 23:
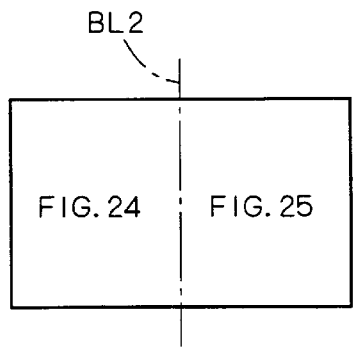
FIG. 23 is an explanatory diagram for the arrangement of FIGS. 24 and 25.
Figure 24:
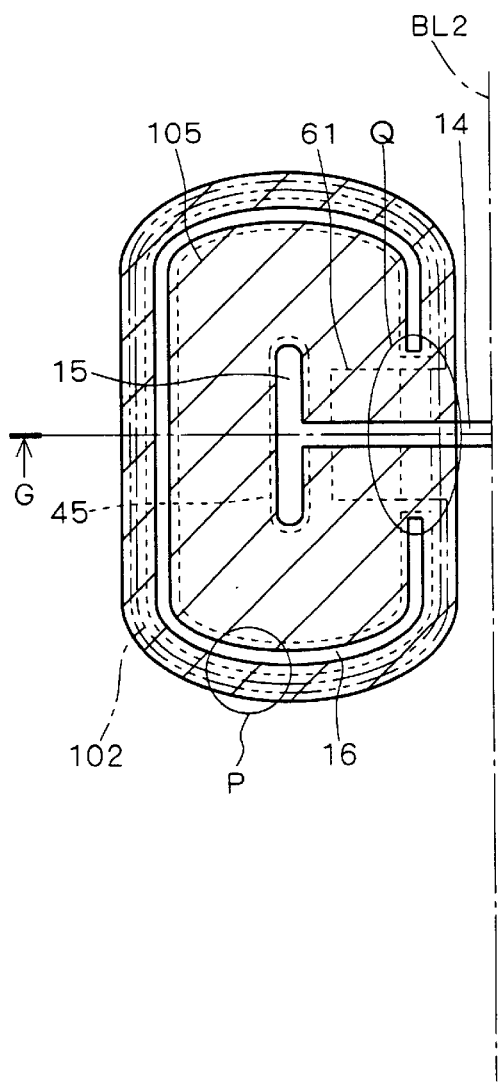
FIGS. 24 and 25 are plan views showing a configuration of a modification of the HVIC according to the fifth preferred embodiment.
Figure 25:
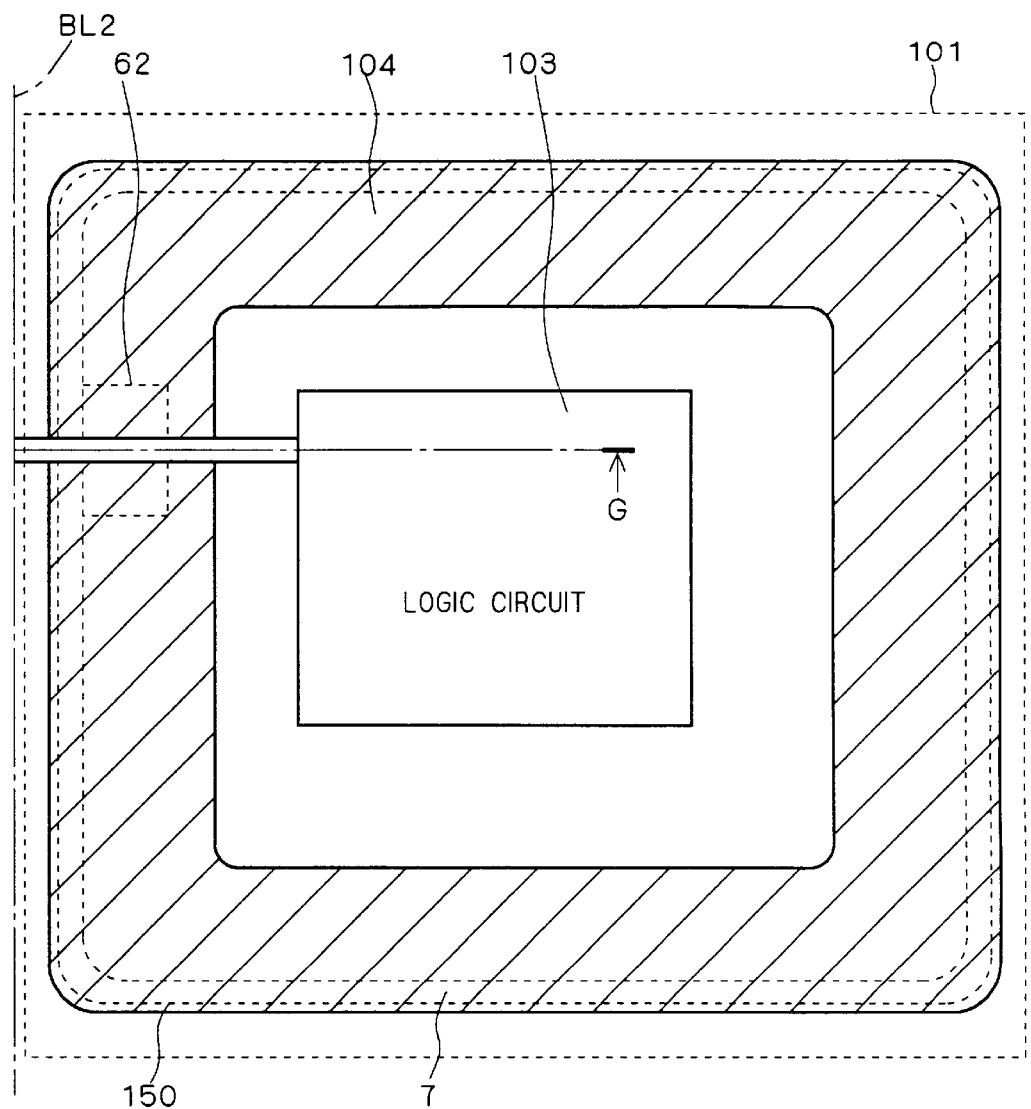
Figure 26:
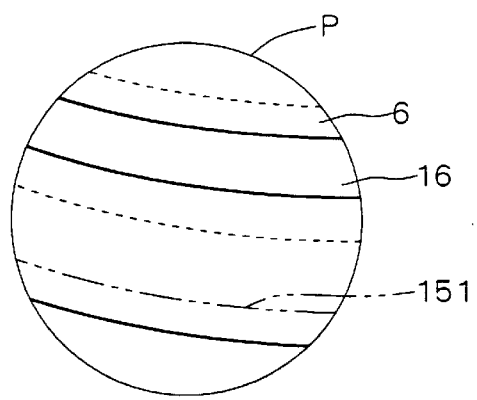
FIGS. 26 and 27 are enlarged plan views showing the configuration of the modification of the HVIC according to the fifth preferred embodiment.
Figure 27:
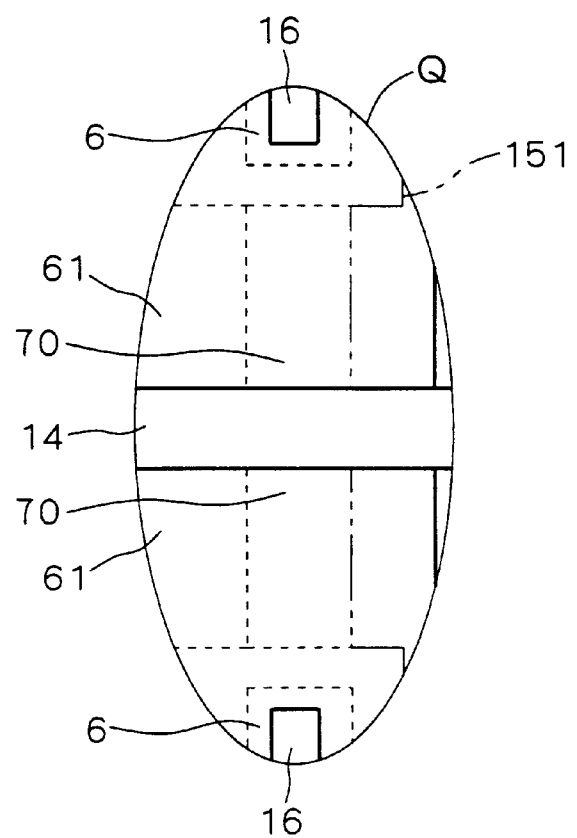
Figure 28:
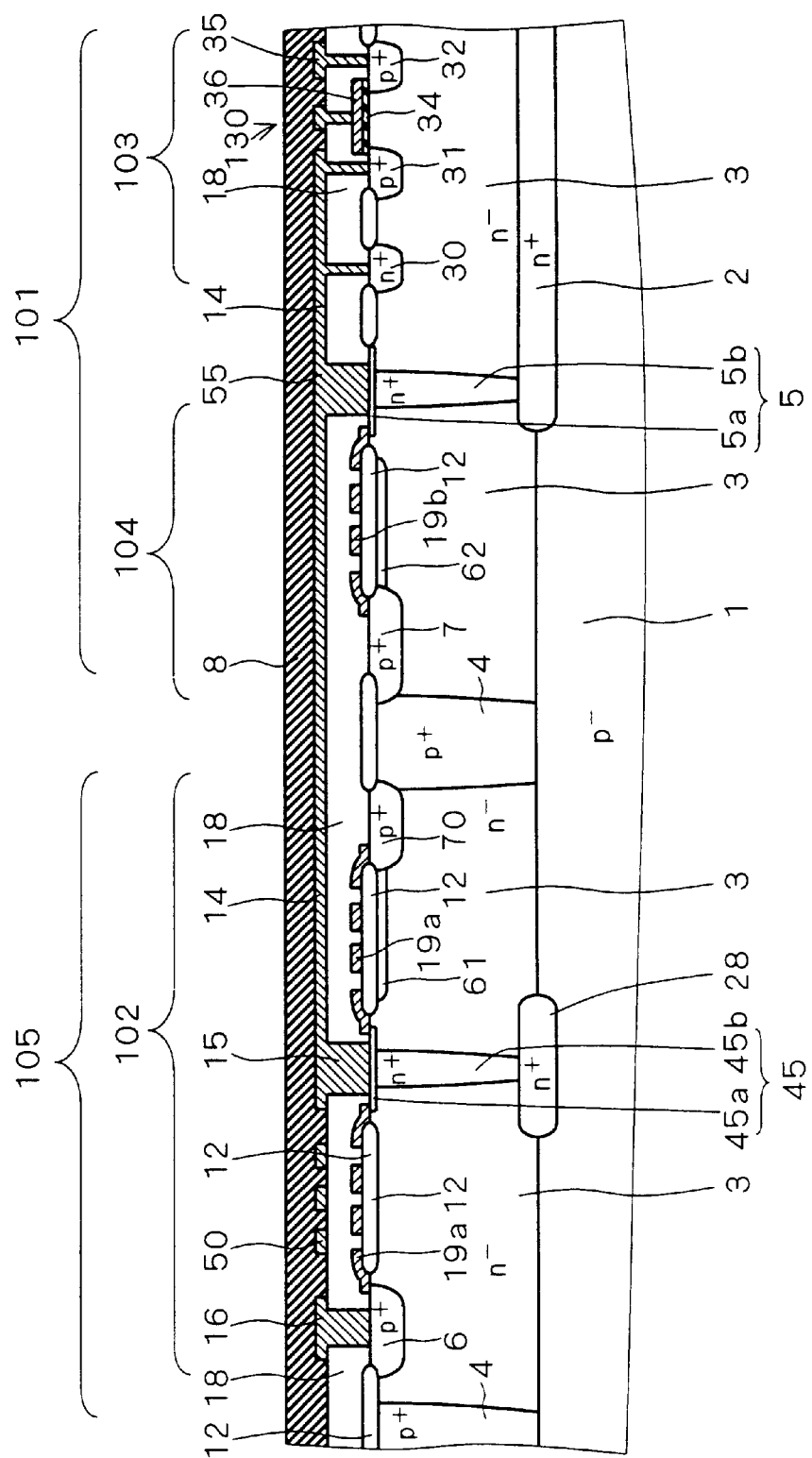
FIG. 28 is a cross-sectional views showing the configuration of the modification of the HVIC according to the fifth preferred embodiment.
Figure 29:
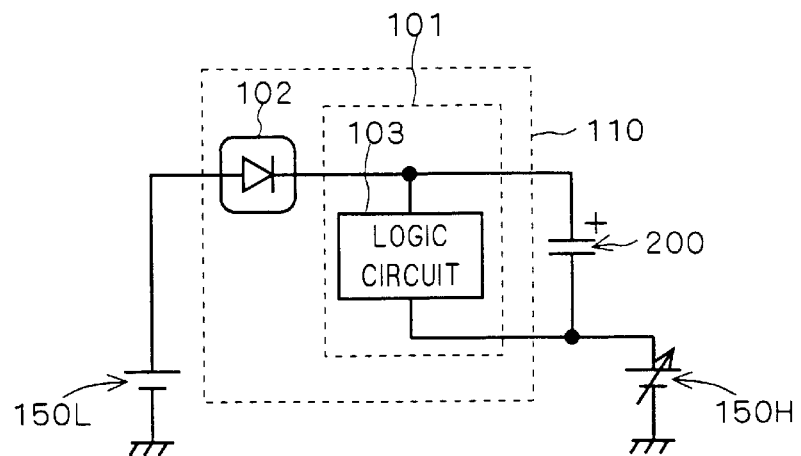
FIG. 29 is a circuit diagram of a conventional HVIC 110 and its peripheral circuits.
Figure 30:
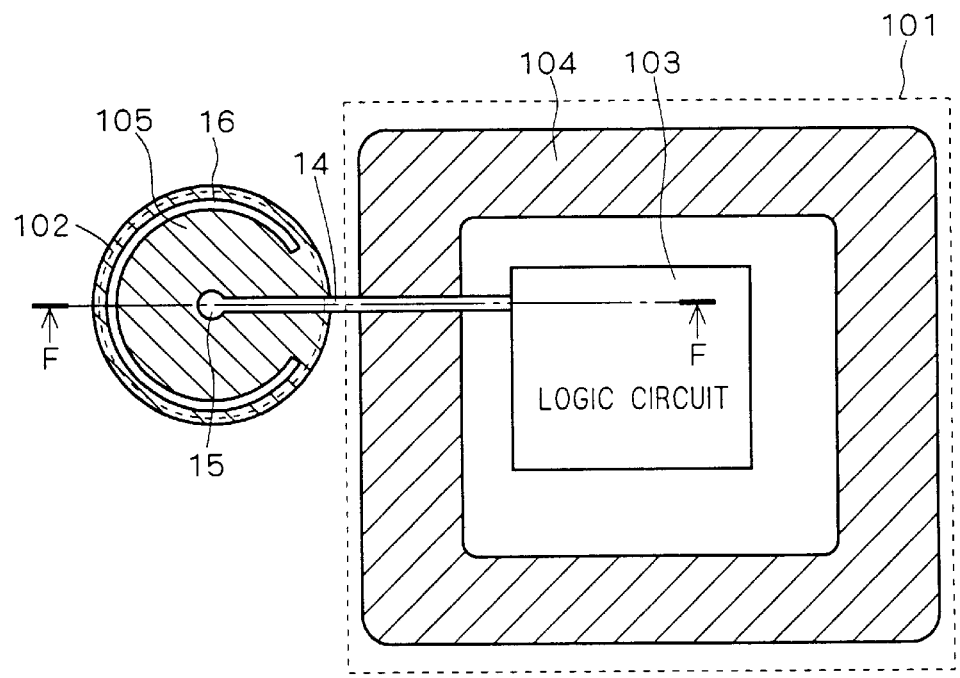
FIG. 30 is a schematic plan view of a configuration of the conventional HVIC 110.
Figure 31:
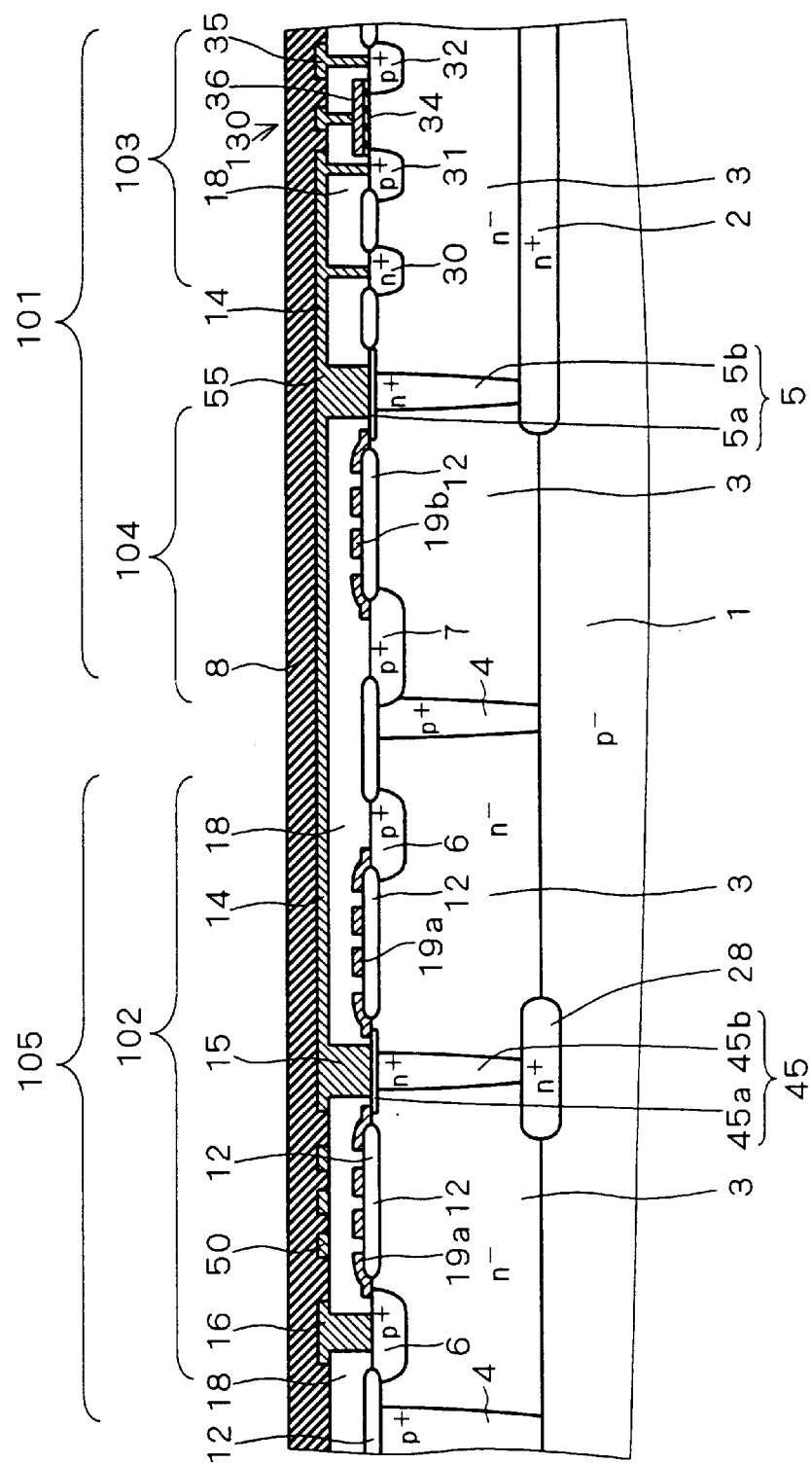
FIG. 31 is a schematic cross-sectional view of the configuration of the conventional HVIC 110.

FIGS. 23 through 28 illustrate a modification of the HVIC according to the fifth preferred embodiment. FIG. 23 is an explanatory diagram for the arrangement of FIGS. 24 and 25, FIGS. 24 and 25 are plan views showing a configuration of a modification of the HVIC according to the fifth preferred embodiment, FIG. 26 is an enlarged plan view of a portion P in FIG. 24, and FIG. 27 is an enlarged plan view of a portion Q in FIG. 24. FIG. 28 is a cross-sectional view taken along the line G—G indicated by the arrows in FIGS. 24 and 25. The dash-dotted line indicating the bootstrap diode 102 and the oblique lines indicating the region 105 in FIG. 24 are not shown in FIGS. 26 and 27.

In the aforementioned HVIC shown in FIGS. 17 to 22, the p⁺ impurity region 6 is formed to entirely surround the n⁺ impurity region 45. In the HVIC shown in FIGS. 23 to 28, on the other hand, the p⁺ impurity region 6 is not formed below the metal electrode 14 and it surrounds only part of the n⁺ impurity region 45. In the surface of the n⁻ semiconductor layer 3 below the metal electrode 14, a p⁺ impurity region 70 connected to the p⁺ impurity region 4 is formed. The p⁻ impurity region 61 is connected to the p⁺ impurity region 70 and located below the metal electrode 14. Such a configuration can also achieve the same effect as by the HVIC of FIGS. 17 to 22.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a semiconductor substrate of p-type;
    a semiconductor layer of n-type formed on said semiconductor substrate;
    a first impurity region of said p-type formed in said semiconductor layer, extending from a surface of said semiconductor layer to an interface of said semiconductor layer and said semiconductor substrate, to define an island region;
    a buried impurity region of said n-type formed apart from said first impurity region at said interface within said island region, said buried impurity region being of a higher concentration than said semiconductor layer;
    a semiconductor element formed in the surface of said semiconductor layer above said buried impurity region; and
    a diode having a second impurity region of said p-type and a third impurity region of said n-type,
    said second impurity region being formed in the surface of said semiconductor layer above said interface between said first impurity region and said buried impurity region,
    said third impurity region being formed in the surface of said semiconductor layer apart from and between said second impurity region and said semiconductor element,
    wherein a potential applied to said semiconductor substrate and said first impurity region is lower than that applied to said second impurity region and said third impurity region.

2. The semiconductor device according to claim 1, wherein
    a depth of said second impurity region in a direction to said semiconductor substrate and a distance between said second impurity region and said first impurity region are determined to provide a desired emitter-collector breakdown voltage of a parasitic bipolar transistor in which said semiconductor substrate and said first impurity region serve as an emitter, said semiconductor layer as a base, and said second impurity region as a collector.

3. The semiconductor device according to claim 1, further comprising:
    a fourth impurity region of said p-type connected to said second impurity region and formed in the surface of said semiconductor layer, extending toward said third impurity region, said fourth impurity region being of a lower concentration than said second impurity region.

4. The semiconductor device according to claim 3, wherein a depletion layer is formed across the whole of said fourth impurity region.

5. The semiconductor device according to claim 1, wherein
    said first impurity region has a bent portion, and
    said second impurity region arid said third impurity region are opposed to each other along said bent portion.

6. The semiconductor device according to claim 1, wherein
    said second impurity region and said third impurity region are opposed to each other along said first impurity region, and said third impurity region is longer in length than said second impurity region along the surface of said semiconductor layer.

7. A semiconductor device comprising:

a semiconductor substrate of p-type;

a semiconductor layer of n-type formed on said semiconductor substrate;

a first impurity region of said p-type formed in said semiconductor layer, extending from a surface of said semiconductor layer to an interface of said semiconductor layer and said semiconductor substrate, to define a first island region and a second island region;

a buried impurity region of said n-type formed apart from said first impurity region at said interface within said first island region;

a semiconductor element formed in the surface of said semiconductor layer above said buried impurity region;

a diode having a second impurity region of said p-type and a third impurity region of said n-type which are formed in the surface of said semiconductor layer within said second island region, said second impurity region being located closer to said semiconductor element than said third impurity region;

a metal electrode connected to said third impurity region and passing over said second impurity region and said first impurity region to be connected to said semiconductor element; and a fourth impurity region of said p-type connected to said second impurity region and formed in the surface of said semiconductor layer to be located below said metal electrode, said fourth impurity region being of a lower concentration than said second impurity region, wherein a potential applied to said semiconductor substrate and said first impurity region is lower than that applied to said second impurity region and said third impurity region.

8. The semiconductor device according to claim 7, wherein a depletion layer is formed across the whole of said fourth impurity region.

9. A semiconductor device comprising:

a semiconductor substrate of p-type;

a semiconductor layer of n-type formed on said semiconductor substrate;

a first impurity region of said p-type formed in said semiconductor layer, extending from a surface of said semiconductor layer to an interface of said semiconductor layer and said semiconductor substrate, to define a first island region and a second island region;

a buried impurity region of said n-type formed apart from said first impurity region at said interface within said first island region, said buried impurity region being of a higher concentration than said semiconductor layer;

a semiconductor element formed in the surface of said semiconductor layer above said buried impurity region;

a diode having a second impurity region of said p-type and a third impurity region of said n-type which are formed in the surface of said semiconductor layer within said second island region;

a metal electrode connected to said third impurity region and passing over said first impurity region to be connected to said semiconductor element; and a fourth impurity region of said p-type connected to said first impurity region and formed in the surface of said semiconductor layer to be located below said metal electrode, said fourth impurity region being of a lower concentration than said first impurity region, wherein a potential applied to said semiconductor substrate and said first impurity region is lower than that applied to said second impurity region and said third impurity region.

10. The semiconductor device according to claim 9, wherein a depletion layer is formed across the whole of said fourth impurity region.

* * * * *